(12) United States Patent
Fukuzaki et al.

(10) Patent No.: US 12,259,581 B2
(45) Date of Patent: Mar. 25, 2025

(54) INTEGRATED OPTICAL DEVICE, INTEGRATED OPTICAL MODULE, AND METHOD FOR MANUFACTURING INTEGRATED OPTICAL DEVICE

(71) Applicant: TDK CORPORATION, Tokyo (JP)

(72) Inventors: Ryohei Fukuzaki, Tokyo (JP); Masahiro Shinkai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 322 days.

(21) Appl. No.: 17/793,596

(22) PCT Filed: Dec. 23, 2020

(86) PCT No.: PCT/JP2020/048263
§ 371 (c)(1),
(2) Date: Jul. 18, 2022

(87) PCT Pub. No.: WO2021/149450
PCT Pub. Date: Jul. 29, 2021

(65) Prior Publication Data
US 2023/0134378 A1    May 4, 2023

(30) Foreign Application Priority Data

Jan. 21, 2020  (JP) ................................ 2020-007205
Mar. 26, 2020  (JP) ................................ 2020-056032

(51) Int. Cl.
*G02B 6/36*  (2006.01)
*G02B 6/12*  (2006.01)

(52) U.S. Cl.
CPC ............. *G02B 6/3652* (2013.01); *G02B 6/12* (2013.01); *G02B 2006/12121* (2013.01)

(58) Field of Classification Search
CPC ................... G02B 6/12; G02B 6/3652; G02B 2006/12121
See application file for complete search history.

(56) References Cited

U.S. PATENT DOCUMENTS

| 8,274,867 B2 * | 9/2012 | Mori ...................... G11B 5/105 369/13.13 |
| 2004/0202212 A1 | 10/2004 | Yamauchi |

(Continued)

FOREIGN PATENT DOCUMENTS

| CN | 1538411 A | 10/2004 |
| JP | H11-194224 A | 7/1999 |

(Continued)

OTHER PUBLICATIONS

Mar. 30, 2021 International Search Report issued in Patent Application No. PCT/JP2020/048263.

*Primary Examiner* — Tina M Wong
(74) *Attorney, Agent, or Firm* — Oliff PLC

(57) ABSTRACT

An integrated optical device includes: a mounting base; an optical semiconductor device which is provided on a surface of the mounting base; a substrate; and an optical waveguide which is provided on a surface of the substrate, wherein an incident surface of the optical waveguide is disposed to face an emission surface of the optical semiconductor device, wherein light emitted from the optical semiconductor device is able to be incident to the optical waveguide, wherein the optical semiconductor device is connected to the mounting base through a metal layer, wherein the mounting base is connected to the substrate through the other metal layer, and wherein a mounting base bottom surface on the side opposite to a surface of the mounting base and a substrate bottom surface on the side opposite to a surface of the substrate are provided on the substantially same plane.

14 Claims, 22 Drawing Sheets

(56) References Cited

U.S. PATENT DOCUMENTS

| | | |
|---|---|---|
| 2009/0103923 A1 | 4/2009 | Hosomi et al. |
| 2010/0108117 A1 | 5/2010 | Hamano et al. |
| 2011/0110622 A1 | 5/2011 | Akutsu et al. |
| 2011/0242697 A1 | 10/2011 | Mori et al. |
| 2017/0146744 A1 | 5/2017 | Katsuyama et al. |

FOREIGN PATENT DOCUMENTS

| | | |
|---|---|---|
| JP | 2000-284135 A | 10/2000 |
| JP | 2002-323629 A | 11/2002 |
| JP | 2005-309370 A | 11/2005 |
| JP | 2009-105106 A | 5/2009 |
| JP | 2010-109132 A | 5/2010 |
| JP | 2011-102819 A | 5/2011 |
| JP | 2016-118750 A | 6/2016 |
| WO | 2015/170505 A1 | 11/2015 |
| WO | 2020/196489 A1 | 10/2020 |

* cited by examiner

INTEGRATED OPTICAL DEVICE, INTEGRATED OPTICAL MODULE, AND METHOD FOR MANUFACTURING INTEGRATED OPTICAL DEVICE

Priority is claimed on Japanese Patent Application No. 2020-007205, filed Jan. 21, 2020 and Japanese Patent Application No. 2020-056032, filed Mar. 26, 2020, the content of which is incorporated herein by reference.

TECHNICAL FIELD

The present invention relates to an integrated optical device, an integrated optical module using the integrated optical device, and a method for manufacturing the integrated optical device.

BACKGROUND ART

With the increase in data traffic, the functions of optical communication systems and various optical devices around us that utilize them are becoming more multifunctional. Recently, there has been a demand for high density as well as multifunctionality, and multi-functional and compact optical devices are being studied.

In optical communication systems, silicon photonics has been technically examined. This integrates a light-emitting element, a light-receiving element, and the like in a silicon optical waveguide.

In addition, compact optical modules are required for devices around us that are multifunctional and portable, such as wearable devices and compact projectors.

Conventionally, a mirror and a lens have been used to integrate a plurality of optical elements into one. For example, Patent Literature 1 discloses an optical module in which a laser diode (LD), an optical lens, a total reflection wavelength filter, a wavelength separation filter, a fiber collimator, and a photodiode are integrated in a housing.

In such an optical module of Patent Literature 1, light having a wavelength of 1.3 µm emitted from the LD passes through a condenser lens, a capillary, and a collimator lens, passes through the total reflection wavelength filter, is totally reflected by the wavelength separation filter, and is received by the fiber collimator. Light having wavelengths of 1.49 µm and 1.55 µm input from the fiber collimator passes through the wavelength separation filter and is separated by a total reflection/wavelength separation filter. The separated light having a wavelength of 1.55 µm is folded back by the total reflection wavelength filter and is incident on the photodiode by a coupling lens. The separated light having a wavelength of 1.49 µm is incident on the photodiode by the coupling lens.

Further, Patent Literature 2 discloses an optical transmission/reception module in which a plurality of light having a predetermined wavelength is incident to a wavelength combiner/demultiplexer having a wavelength selection filter and a mirror mounted on front and back surfaces of a transparent substrate in accordance with the arrangement of the wavelength selection filter and the mirror to combine them with each other by the wavelength combiner/demultiplexer.

As a structure different from the integration using the mirror or the lens as in Patent Literatures 1 and 2, for example, Patent Literatures 3 and 4 disclose an optical device having a waveguide structure. In a combiner disclosed in Patent Literature 3, fiber strands with any N thin cladding are fixed to a chip template and emission ends of the plurality of fiber strands are bundled with each other.

Patent Literature 4 discloses a hybrid integrated optical module in which a semiconductor chip having a semiconductor waveguide and mounted on a first substrate and a PLC chip are integrated.

In the hybrid integrated optical module of Patent Literature 4, an end surface facing the PLC chip in the semiconductor chip and an end surface facing the semiconductor chip in the PLC chip are separated from each other with a gap. Further, the semiconductor chip and the PLC chip are bonded with an ultraviolet-curable adhesive.

CITATION LIST

Patent Literature

[Patent Literature 1]
   Japanese Unexamined Patent Application No. 2005-309370
[Patent Literature 2]
   Japanese Unexamined Patent Application No. 2009-105106
[Patent Literature 3]
   Japanese Unexamined Patent Application No. 2016-118750
[Patent Literature 4]
   Japanese Unexamined Patent Application No. 2011-102819

SUMMARY OF INVENTION

Technical Problem

However, in the optical devices disclosed in Patent Literatures 1 and 2 there are a large number of components, the size of each component is large, and the optical device is composed of a free space optical system using a mirror and a lens. Considering the size of each component and the configuration of the free space optical system, there is a limit to the miniaturization of the optical devices disclosed in Patent Literatures 1 and 2. On the other hand, as disclosed in Patent Literatures 3 and 4, the integrated optical device using the waveguide can be easily reduced in size as compared with the free space optical system.

However, in a hybrid integrated optical module 1 described in Patent Literature 4, a semiconductor chip 2 is bonded to a PLC chip 3 and a Si bench 5 is bonded to a PLC substrate 6 by an ultraviolet-curable adhesive 8 (FIG. 1, paragraph 0025 and the like). Therefore, since the UV-curable adhesive expands and contracts due to temperature changes according to the wire-bonding process of the light source, there is a risk that the alignment accuracy of the components bonded to each other will decrease and the reliability of the integrated optical device will decrease. Further, in order to operate an optical semiconductor device such as LD, it is necessary to conduct electricity and it is necessary to connect the optical semiconductor element to a power supply on a substrate by using a method such as wire-bonding. However, if the strength for fixing the optical semiconductor element to the optical waveguide is not sufficient, the optical semiconductor element may slip off the optical waveguide during wire-bonding.

Further, the heat generated by the semiconductor chip 2 and the PLC chip 3 is mainly dissipated through the package on which the chips are mounted. However, since at least one of the semiconductor chip 2 and the PLC chip 3 has a large separation from the package due to the expansion and contraction of the UV-curable adhesive, there is a problem in that stable laser beam output cannot be obtained when emitting a laser beam that has insufficient heat dissipation and has temperature dependence.

The present invention has been made in view of such circumstances and an object thereof is to provide an integrated optical device in which temperature dependence in laser emission is suppressed and a bonding strength of components to a package is improved and an integrated optical module using the same.

Solution to Problem

An integrated optical device according to a first aspect of the present invention includes: a mounting base; an optical semiconductor device which is provided on a surface of the mounting base; a substrate; and an optical waveguide which is provided on a surface of the substrate, wherein an incident surface of the optical waveguide is disposed to face an emission surface of the optical semiconductor device, wherein light emitted from the optical semiconductor device is able to be incident to the optical waveguide, wherein the optical semiconductor device is connected to the mounting base through a metal layer, wherein the mounting base is connected to the substrate through the other metal layer, and wherein a mounting base bottom surface on the side opposite to a surface of the mounting base and a substrate bottom surface on the side opposite to a surface of the substrate are provided on the substantially same plane.

In the integrated optical device according to the above-described aspect, an antireflection film may be provided between the optical semiconductor device and the optical waveguide.

In the integrated optical device according to the above-described aspect, a plurality of the optical semiconductor devices may be provided, the plurality of optical semiconductor devices may emit light having different wavelengths, the optical waveguide may be provided with a core into which light emitted from the plurality of optical semiconductor devices is able to be incident, and the plurality of cores may be gathered together on the front side reaching the emission surface of the optical waveguide.

In the integrated optical device according to the above-described aspect, the mounting base may include first to third outer surfaces, the first outer surface may be a surface of the mounting base, the optical semiconductor device may be mounted on the first outer surface of the mounting base, the optical semiconductor device may be disposed to be optically coupled to the optical waveguide, the second outer surface of the mounting base may be connected to a side surface of the substrate through the metal layer, and at least a part of the third outer surface of the mounting base may include a roughened region.

In the integrated optical device according to the above-described aspect, the surface roughness of the roughened region may be larger than the surface roughness of the first and second outer surfaces.

In the integrated optical device according to the above-described aspect, the roughened region may have a maximum cross-sectional height (Rt) of 5 μm or more and 50 μm or less or 5 μm or more and 30 μm or less.

In the integrated optical device according to the above-described aspect, the mounting base may have a substantially rectangular parallelepiped shape, the second outer surface may be a first side surface of the mounting base, and the third outer surface may include a second side surface which faces the first side surface, third and fourth side surfaces which are respectively adjacent to the first and second side surfaces to face them, and the mounting base bottom surface which faces the upper surface.

In the integrated optical device according to the above-described aspect, the roughened region may be provided on the third and fourth side surfaces, and the second side surface and the mounting base bottom surface may be smooth surfaces not provided with the roughened region.

In the integrated optical device according to the above-described aspect, the roughened region may be provided in the entire surfaces of the third and fourth side surfaces.

In the integrated optical device according to the above-described aspect, the roughened region may be provided in a front region near the first side surface in relation to a middle position between the first side surface and the second side surface.

In the integrated optical device according to the above-described aspect, the roughened region may be provided in a lower region near the mounting base bottom surface in relation to a middle position between the upper surface and the mounting base bottom surface.

In the integrated optical device according to the above-described aspect, two or more optical semiconductor devices may be provided.

In the integrated optical device according to the above-described aspect, the optical semiconductor device may include a first optical semiconductor device which outputs red light, a second optical semiconductor device which outputs green light, and a third optical semiconductor device which outputs blue light.

An integrated optical module according to a second aspect of the present invention includes: the above-described integrated optical device; and a package which accommodates the integrated optical device, wherein in the integrated optical device, both the mounting base bottom surface and the substrate bottom surface are fixed to one inner surface of the package through an adhesive layer containing metal or resin.

In the integrated optical module according to the above-described aspect, the adhesive layer may be made of a material in which a filler is mixed with a resin.

In the integrated optical module according to the above-described aspect, the adhesive layer may have thermal conductivity of 4 W/m·K or more.

A method for manufacturing an integrated optical device according to a third aspect of the present invention includes: preparing a mounting base including first to third outer surfaces, having an optical semiconductor device mounted on the first outer surface, having a metal bonding material provided in the second outer surface, and having a roughened region formed in at least a part of the third outer surface; adjusting a position of the optical semiconductor device to be optically coupled to an optical waveguide while heating the metal bonding material together with the mounting base by irradiating the roughened region with a laser beam in a state in which a side surface of a substrate provided with the optical waveguide is in contact with the second outer surface of the mounting base; and fixing the optical semiconductor device by stopping the irradiation of the laser beam to cool the mounting base and metal-bonding the mounting base and the substrate.

Advantageous Effects of Invention

According to the present invention, it is possible to provide an integrated optical device which efficiently dissipates heat generated by the operation of an optical semiconductor device and does not cause operational instability due to a temperature change and an integrated optical module using the same.

DESCRIPTION OF EMBODIMENTS

Hereinafter, embodiments of the present invention will be described with reference to the drawings. Additionally, the embodiments shown below are specifically described in order to better understand the gist of the invention and do not limit the present invention unless otherwise specified. Further, the drawings used in the following description may be shown by enlarging the main parts for convenience in order to make the features of the present invention easy to understand and the dimensional ratios of each component are not limited to the same as the actual ones. That is, the materials, dimensions, and the like exemplified in the following description are examples, and the present invention is not limited thereto. These can be appropriately modified and implemented within the range in which the effects of the present invention are exhibited.

First Embodiment (Integrated Optical Device)

Figure 1:
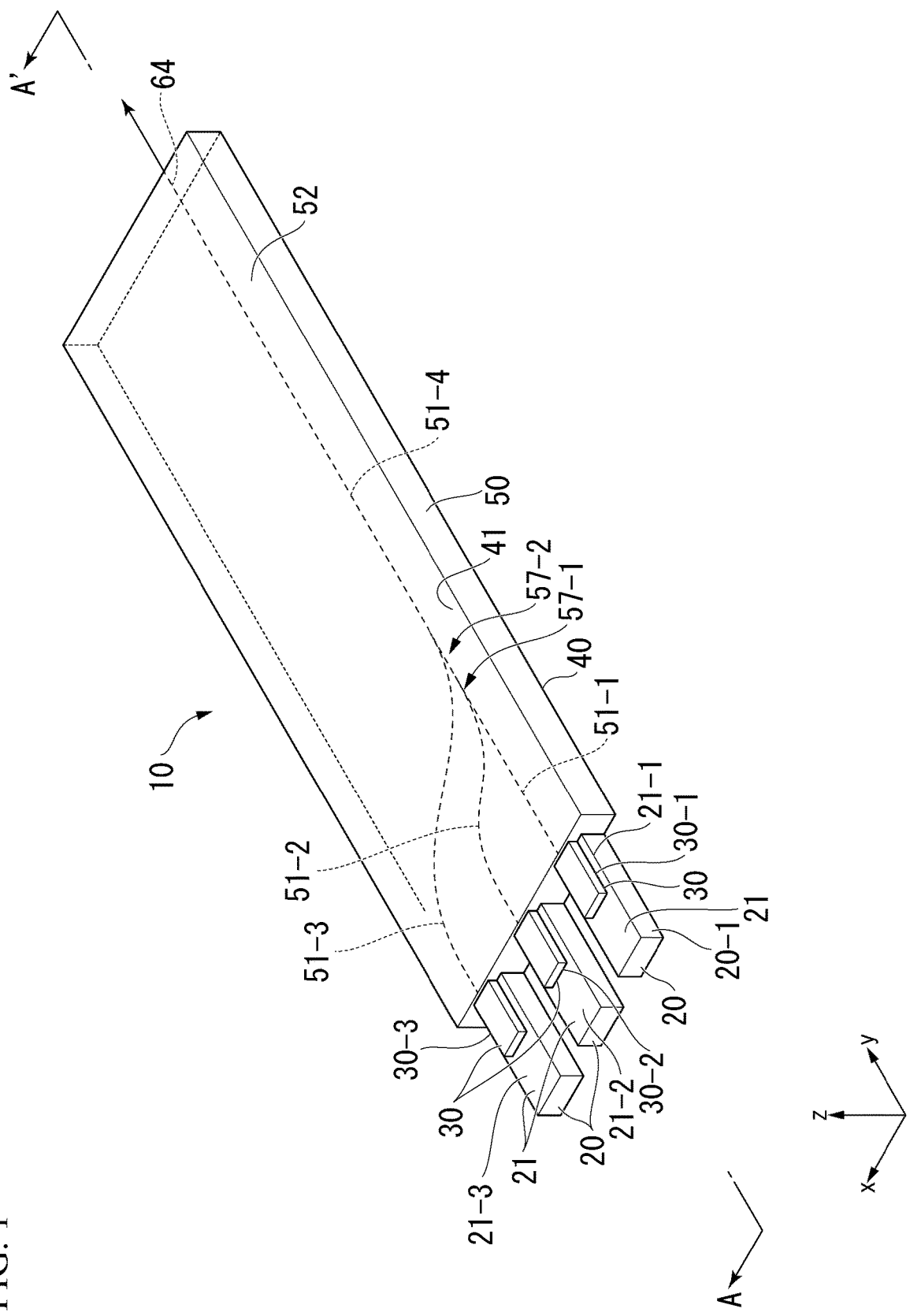
FIG. 1 is a perspective view of an integrated optical device of a first embodiment of the present invention.

As shown in FIG. 1, an integrated optical device 10 according to this embodiment includes a subcarrier (mounting base) 20, an optical semiconductor device (LD) 30 which is provided on an upper surface (surface) 21 of the subcarrier 20, a substrate 40, and an optical waveguide (PLC) 50 which is provided on an upper surface (surface) 41 of the substrate 40.

The integrated optical device 10 is a combiner that combines light of each of the three primary colors of light, red (R), green (G), and blue (B). The integrated optical device 10 can be applied as, for example, a combiner mounted on a head-mounted display. The optical semiconductor device (LD) 30 which is a light source to be used is not limited to red (R), green (G), and blue (B) and in this embodiment, as the optical semiconductor device (LD) 30 of the three primary colors of light shown as an example, various commercially available laser elements of red light, green light, and blue light can be used. It may be selected as appropriate according to the desired application. For example, light having a peak wavelength of 610 nm or more and 750 nm or less can be used as the red light, light having a peak wavelength of 500 nm or more and 560 nm or less can be used as the green light, and light having a peak wavelength of 435 nm or more and 480 nm or less can be used as the blue light.

The integrated optical device 10 includes an LD 30-1 which emits red light, an LD 30-2 which emits green light, and an LD 30-3 which emits blue light. The LDs 30-1, 30-2, and 30-3 are arranged at intervals in a direction substantially orthogonal to the emission direction of the light emitted from each LD and are provided on upper surfaces 21 of the individual subcarriers 20. The LD 30-1 is provided on an upper surface 21-1 of a subcarrier 20-1. The LD 30-2 is provided on an upper surface 21-2 of a subcarrier 20-2. The LD 30-3 is provided on an upper surface 21-3 of a subcarrier 20-3. Hereinafter, in the reference numeral Z of any component of the integrated optical device 10, the contents common to the components of the reference numerals Z-1, Z-2, ..., Z-K may be collectively referred to as the reference numeral Z. The K is a natural number of 2 or more.

Needless to say, light other than red (R), green (G), and blue (B) shown in this embodiment can also be used, and the mounting order of red (R), green (G), and blue (B) described with reference to the drawings does not need to be in this order and can be changed as appropriate.

Figure 4:
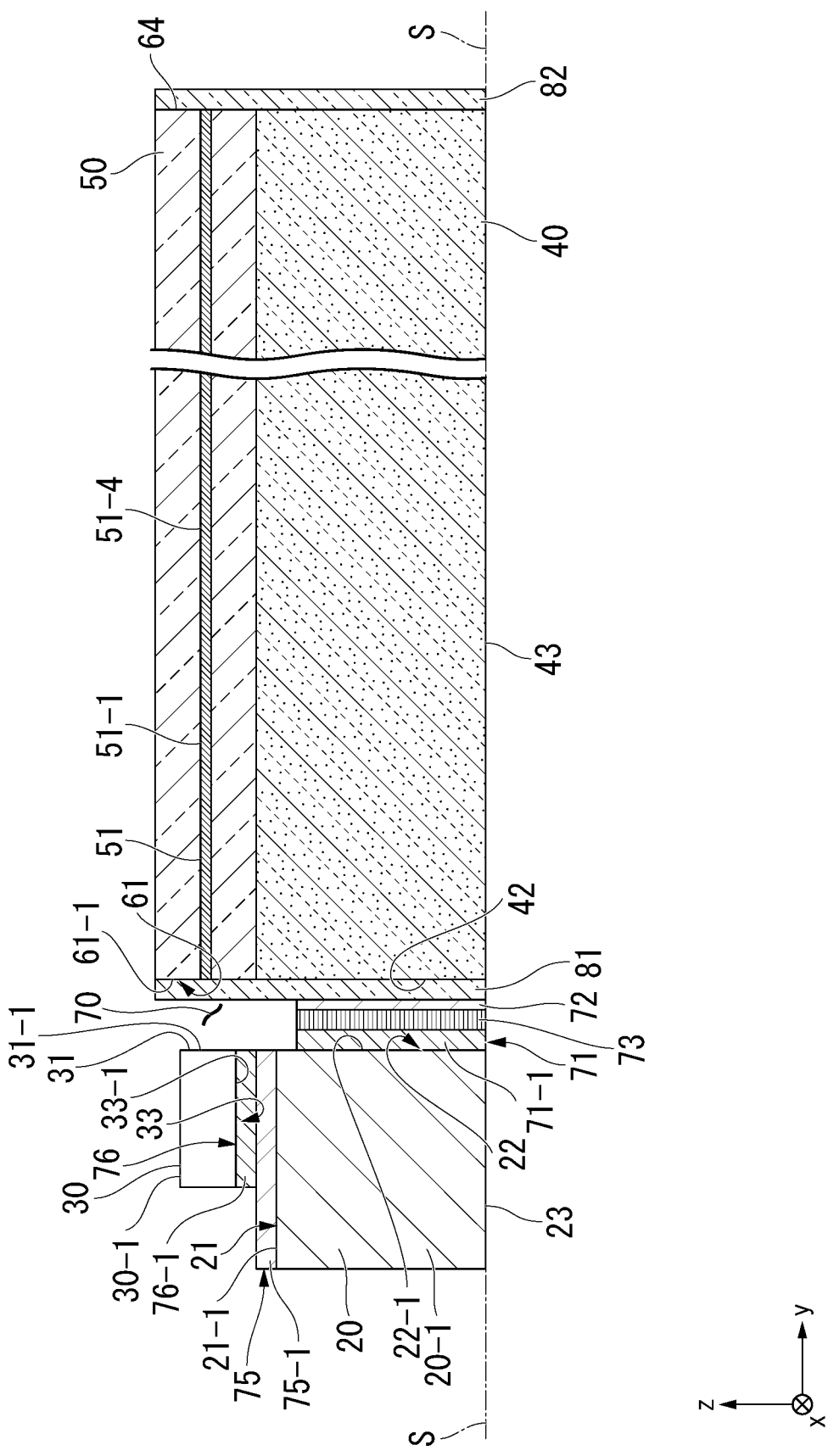
FIG. 4 is a cross-sectional view taken along a line A-A' of the integrated optical device of the first embodiment.

The LD 30 is a bare chip mounted on the subcarrier 20. The subcarrier 20 is made of, for example, aluminum nitride (AlN), aluminum oxide (Al$_2$O$_3$), silicon (Si), or the like. As shown in FIG. 4, metal layers 75 and 76 are provided between the subcarrier 20 and the LD 30. The subcarrier 20 and the LD 30 are connected to each other via the metal layers 75 and 76. As a method of forming the metal layers 75 and 76, a known method can be used and is not particularly limited, but a known method such as sputtering, vapor deposition, or coating of a paste-like metal can be used. The metal layers 75 and 76 may contain one or more metals selected from the group composed of, for example, gold (Au), platinum (Pt), silver (Ag), lead (Pb), indium (In), nickel (Ni), titanium (Ti), tantalum (Ta), tungsten (W), an alloy of gold (Au) and tin (Sn), tin (Sn)-silver (Ag)-copper (Cu)-based solder alloys (SAC), SnCu, InBi, SnPdAg, SnBiIn, and PbBiIn and may be made of one or more metals selected from the group.

Figure 2:
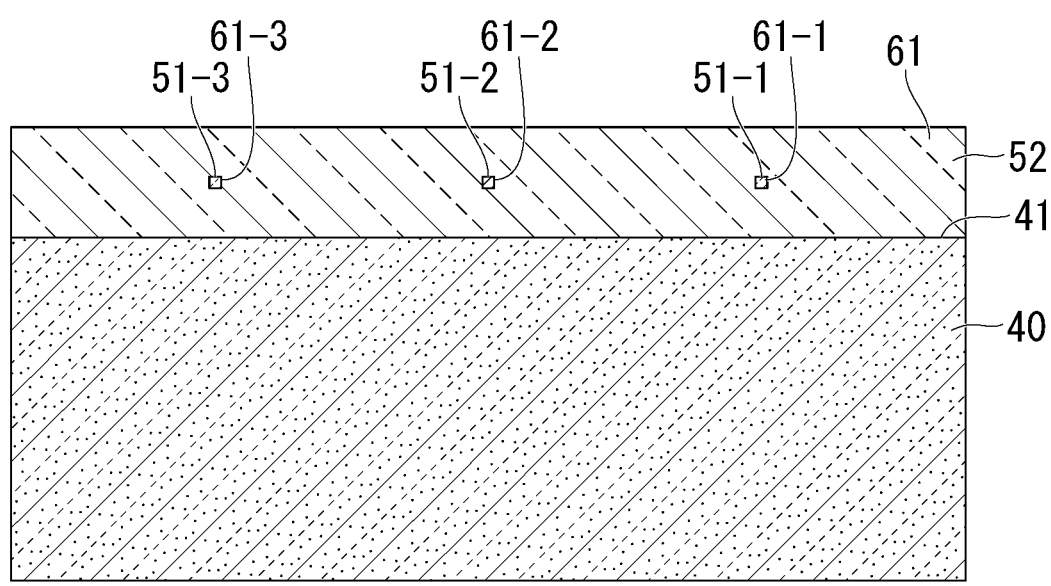
FIG. 2 is a cross-sectional view of an incident surface of a PLC of the integrated optical device of the first embodiment.

The substrate 40 is made of silicon (Si). The PLC 50 is manufactured to be integrated with the substrate 40 on the upper surface 41 by a semiconductor process including known photolithography and dry etching used when forming a fine structure such as an integrated circuit. As shown in FIGS. 1 and 2, the PLC 50 is provided with as many cores 51-1, 51-2, and 51-3 as the LDs 30-1, 30-2, and 30-3 constituting the optical waveguide and a clad 52 surrounding the cores 51-1, 51-2, and 51-3. The thickness of the clad 52 and the widthwise dimensions of the cores 51-1, 51-2, and 51-3 are not particularly limited. For example, the cores 51-1, 51-2, 51-3 having widthwise dimensions of about several microns are arranged in the clad 52 having a thickness of about 50 μm.

The cores 51-1, 51-2, and 51-3 and the clad 52 are made of, for example, quartz. The refractive index of the cores 51-1, 51-2, and 51-3 is higher than the refractive index of the clad 52 by a predetermined value. Accordingly, the light incident on each of the cores 51-1, 51-2, and 51-3 propagates through each core while being totally reflected at the interface between each core and the clad 52. The cores 51-1, 51-2, and 51-3 are doped with impurities such as germanium (Ge) in an amount corresponding to the above-described predetermined values.

Hereinafter, the emission direction of the light emitted from the LD 30 is the y direction. The direction which is orthogonal to the y direction in the plan including the y direction and in which the LDs 30-1, 30-2, and 30-3 are arranged at intervals is the x direction. The direction orthogonal to the x direction and the y direction and directed from the subcarrier 20 to the LD 30 is the z direction. In an incident surface 61 of the PLC 50, the cores 51-1, 51-2, and 51-3 are arranged to match the optical axis of the light emitted from the LDs 30-1, 30-2, and 30-3 in the x direction and the z direction.

As shown in FIGS. 1 and 4, the cores 51-1, 51-2, and 51-3 are gathered together on the front side reaching the emission surface 64 of the PLC 50. That is, the cores 51-1, 51-2, and 51-3 approach each other sequentially toward the front side in the y direction and merge with one core 51-4. It is preferable that each of the cores 51-1, 51-2, and 51-3 be connected to the core 51-4 at a curvature radius equal to or larger than a predetermined curvature radius so that light does not leak from the cores 51-1, 51-2, and 51-3.

Figure 3:
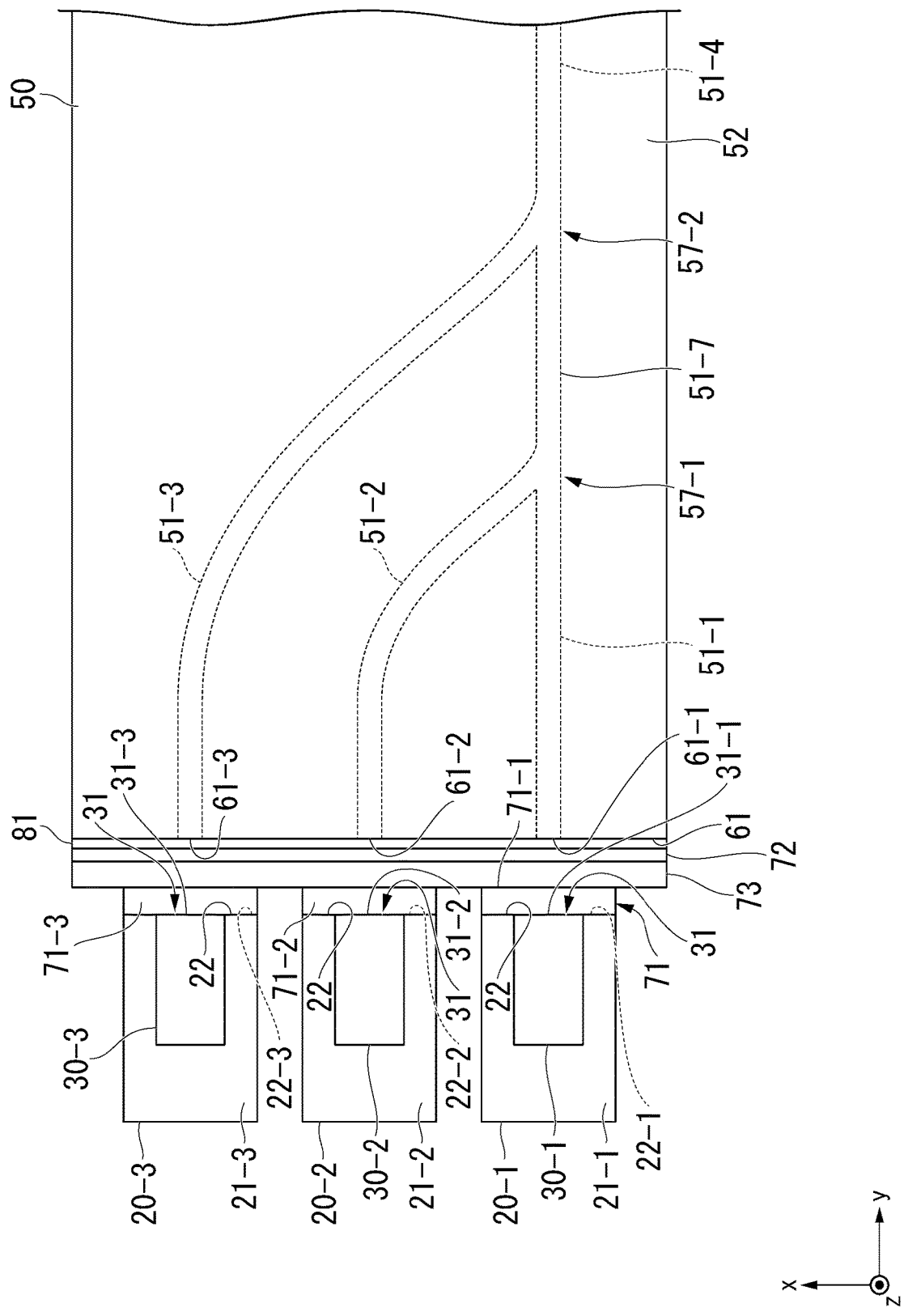
FIG. 3 is a plan view of a part of the integrated optical device of the first embodiment.

As shown in FIG. 3, the incident surface 61 of the PLC 50 is disposed to face the emission surface 31 of the LD 30. Specifically, the emission surface 31-1 of the LD 30-1 faces the incident surface 61-1 of the core 51-1. In the x direction and the z direction, the optical axis of the red light emitted from the LD 30-1 substantially overlaps with the center of the incident surface 61-1. Similarly, the emission surface 31-2 of the LD 30-2 faces the incident surface 61-2 of the core 51-2. In the x direction and the z direction, the optical axis of the green light emitted from the LD 30-2 substantially overlaps with the center of the incident surface 61-2. The emission surface 31-3 of the LD 30-3 faces the incident surface 61-3 of the core 51-3. In the x direction and the z direction, the optical axis of the blue light emitted from the LD 30-3 substantially overlaps with the center of the incident surface 61-3. With such a configuration and arrangement, at least a part of the red light, the green light, and the blue light emitted from the LDs 30-1, 30-2, and 30-3 can be incident to the cores 51-1, 51-2, and 51-3.

As shown in FIG. 1, the red light, the green light, and the blue light emitted from the LDs 30-1, 30-2, and 30-3 are respectively incident to the cores 51-1, 51-2, and 51-3 and propagate through the cores. The cores 51-1 and 51-2 and the red light and the green light propagated through these cores merge at a predetermined merging position 57-1 (see FIG. 3) behind a merging position 57-2 in the y direction. The core 51-7 (see FIG. 3) at which the cores 51-1 and 51-2 merge with each other, the core 51-3, and the red light, the green light and the blue light propagating through these cores meet at a merging position 57-2. The red light, the green light, and the blue light collected at the merging position 57-2 propagated through the core 51-4 and reaches the emission surface 64. The three-color light emitted from the emission surface 64 is used, for example, as signal light or the like depending on the purpose of use of the integrated optical device 10.

As shown in FIG. 4, the subcarrier 20 is connected to the substrate 40 through a first metal layer 71, a second metal layer 72, and a third metal layer 73. In this embodiment, a side surface (first side surface) 22 (22-1, 22-2, 22-3) facing the substrate 40 in the subcarrier 20 and a side surface (second side surface) 42 facing the subcarrier 20 in the substrate 40 are connected to each other through the first metal layer 71, the second metal layer 72, the third metal layer 73, and an antireflection film 81. The melting point of the metal layer 75 is higher than the melting point of the third metal layer 73.

The first metal layer 71 is provided while being in contact with a side surface 22 by sputtering, vapor deposition, or the like, may contain one or more metals selected from the group composed of, for example, gold (Au), platinum (Pt), silver (Ag), lead (Pb), indium (In), nickel (Ni), titanium (Ti), and tantalum (Ta), and may be made of one or more metals selected from the group. Preferably, the first metal layer 71 contains at least one metal selected from the group composed of gold (Au), platinum (Pt), silver (Ag), lead (Pb), indium (In), and nickel (Ni). The second metal layer 72 is provided while being in contact with a side surface 42 by sputtering, vapor deposition, or the like, may contain one or more metals selected from the group composed of, for example, titanium (Ti), tantalum (Ta), and tungsten (W), and may be made of one or more metals selected from the group. Preferably, tantalum (Ta) is used for the second metal layer 72. The third metal layer 73 is interposed between the first metal layer 71 and the second metal layer 72, may contain one or more metals selected from the group composed of, for example, aluminum (Al), copper (Cu), AuSn, SnCu, InBi, SnAgCu, SnPdAg, SnBiIn, and PbBiIn, and may be made of one or more metals selected from the group. Preferably, AuSn, SnAgCu, and SnBiIn are used for the third metal layer 73.

The thickness of the first metal layer 71, that is, the size of the first metal layer 71 in the y direction is, for example, 0.01 μm or more and 5.00 μm or less. The thickness of the second metal layer 72, that is, the size of the second metal layer 72 in the y direction is, for example, 0.01 μm or more and 1.00 μm or less. The thickness of the third metal layer 73, that is, the size thereof in the y direction is, for example 0.01 μm or more and 5.00 μm or less. Further, it is preferable that the thickness of the third metal layer 73 be larger than the thickness of each of the first metal layer 71 and the second metal layer 72. In such a configuration, each of the above-described roles of the first metal layer 71, the second metal layer 72, the third metal layer 73 is well expressed and the entry of the material of the first metal layer 71 into the substrate 40 and the decrease in the adhesive strength between the metal layers are suppressed. The thicknesses of the first metal layer 71, the second metal layer 72, and the third metal layer 73 are measured, for example, by spectroscopic ellipsometry.

In this embodiment, the first metal layer 71 is provided on the side surface facing the PLC 50 or the substrate 40 in the substantially entire area of the side surface 22 while not being in contact with the metal layer 75. The front ends, that is, the upper ends of the second metal layer 72 and the third metal layer 73 in the z direction reach, for example, the same position as the upper end of the first metal layer 71 on the front side of the z direction. The rear ends, that is, the lower ends of the second metal layer 72 and the third metal layer 73 in the z direction reach, for example, the same positions as the lower ends of the subcarrier 20, the first metal layer 71, and the substrate 40. When viewed from the y direction, the first metal layer 71 is formed to be larger than the subcarrier 20 in the x direction.

As in the above-described configuration, it is preferable that the area of the first metal layer 71, that is, the size thereof in the plane including the x direction and the z direction be substantially the same as the area of the second metal layer 72 and the third metal layer 73 and the lower end thereof reach the same position as the lower end of the subcarrier 20. In such a configuration, the connection strength of the subcarrier 20 to the substrate 40 is secured to the maximum. That is, it is possible to suppress the connection between the subcarrier 20 and the substrate 40 from being disconnected, for example, even when each of the LD 30 and the subcarrier 20 is connected to an internal electrode pad 202 corresponding to each LD 30 in a plurality of internal electrode pads 202 by wire-bonding using a wire 95 as described below. Further, since the lower ends of the subcarrier 20, the first metal layer 71, the second metal layer 72, the third metal layer 73, and the substrate 40 reach the same position, the heat dissipation path from the subcarrier 20 can be increased. In addition, the area of the first metal layer 71 may be smaller than the area of the second metal layer 72 and the third metal layer 73.

In the integrated optical device 10 according to this embodiment, the antireflection film 81 is provided between the LD 30 and the PLC 50. For example, the antireflection film 81 is integrally formed with the side surface 42 of the substrate 40 and the incident surface 61 of the PLC 50. However, the antireflection film 81 may be formed only on the incident surface 61 of the PLC 50.

In the integrated optical device 10, the antireflection film 82 is also formed on the emission surface 64 in addition to the incident surface 61. Additionally, FIG. 1 shows a schematic configuration of the integrated optical device 10 and the first metal layer 71, the second metal layer 72, the third metal layer 73, and the antireflection films 81 and 82 are omitted.

The antireflection films 81 and 82 are films for preventing the light incident to or emitted from the PLC 50 from being reflected from the incident surface 61 or the emission surface 64 in the direction opposite to the direction in which the light is incident to each surface and increasing the transmittance of the incident light or emitted light. The antireflection films 81 and 82 are multilayer films formed by alternately laminating, for example, a plurality of types of dielectrics corresponding to the wavelengths of the red light, the green light, and the blue light which are the incident light in a predetermined thickness. Examples of the above-described dielectric include titanium oxide ($TiO_2$), tantalum oxide ($Ta_2O_5$), silicon oxide ($SiO_2$), aluminum oxide ($Al_2O_3$), and the like.

The emission surface 31 of the LD 30 and the incident surface 61 of the PLC 50 are arranged at a predetermined interval. The incident surface 61 faces the emission surface 31 and a gap 70 is formed between the emission surface 31 and the incident surface 61 in the y direction. Since the integrated optical device 10 is exposed to air, the gap 70 is full of air. Considering the point that the integrated optical device 10 is used for the head-mounted display and the amount of light required for the head-mounted display, the size of the gap (distance) 70 in the y direction is, for example, larger than 0 μm and 5 μm or less.

As shown in FIG. 4, in the integrated optical device 10 of this embodiment, a bottom surface (mounting base bottom surface) 23 facing the upper surface (surface) 21 of the subcarrier (mounting base) 20 and a bottom surface (substrate bottom surface) 43 facing the upper surface (surface) 41 of the substrate 40 are provided to be located on the substantially same plane S. In the integrated optical device 10 of this embodiment, since the subcarrier (mounting base) 20 and the substrate 40 are connected through the metal layer, the occurrence of positional deviation due to the heating process is remarkably suppressed compared with the hybrid integrated optical module of Patent Document 4 having a structure connected by an adhesive.

Additionally, the substantially same plane S described herein allows a slight deviation between the bottom surface (mounting base bottom surface) 23 and the bottom surface (substrate bottom surface) 43. Specifically, the deviation in the range of 20 μm or less with respect to the thickness of the substrate 40 in the z direction is allowed. However, since it is preferable that the deviation become smaller, the deviation is more preferably 10 μm or less and further preferably 5 μm or less.

In this embodiment, when a bottom surface 23 of the subcarrier 20 and a bottom surface 43 of the substrate 40 are formed on the substantially same plane S, both the subcarrier 20 and the substrate 40 can be bonded, for example, on one plane of a package or heat sink. Accordingly, compared with the conventional integrated optical device in which the bottom surface of the subcarrier and the bottom surface of the substrate are not on the substantially same plane and any one bottom surface is bonded, the integrated optical device 10 of this embodiment can efficiently dissipate the heat generated by the operation of the optical semiconductor device (LD) 30 to both the bottom surface 23 of the subcarrier 20 and the bottom surface 43 of the substrate 40.

Further, since the bottom surface 23 of the subcarrier 20 and the bottom surface 43 of the substrate 40 are provided on the substantially same plane S in this embodiment, both the bottom surface 23 of the subcarrier 20 and the bottom surface 43 of the substrate 40 can be bonded to one plane of the substrate or the like when the integrated optical device 10 is bonded to one plane of another substrate or the like. Accordingly, it is possible to maintain a high bonding strength and to realize the integrated optical device 10 having excellent impact resistance.

For example, when the bottom surface of the subcarrier is located in the +z direction in relation to the bottom surface of the substrate, that is, the bottom surface of the subcarrier is disposed to be separated upward from a base 180 (see FIG. 7) of a package 110 in relation to the bottom surface of the substrate, the subcarrier may slip off when wire-bonding described later is performed in a state in which the size of the first side surface of the subcarrier is small, heat dissipation cannot be performed efficiently, and the bonding strength with the substrate is not sufficient. However, in the integrated optical device 10 according to this embodiment, since it is possible to sufficiently perform the heat dissipation from the bottom surface 23 and the side surface 22 or the bonding with the substrate 40 by sufficiently ensuring the size of the side surface 22, it is possible to improve heat dissipation or impact resistance. Since the impact resistance is improved, for example, the LD 30 is maintained at an optimal position with respect to the PLC 50. Thus, it is possible to improve the reliability of the integrated optical device 10 by exhibiting desired light utilization efficiency and optical characteristics in the integrated optical device 10.

Figure 5:
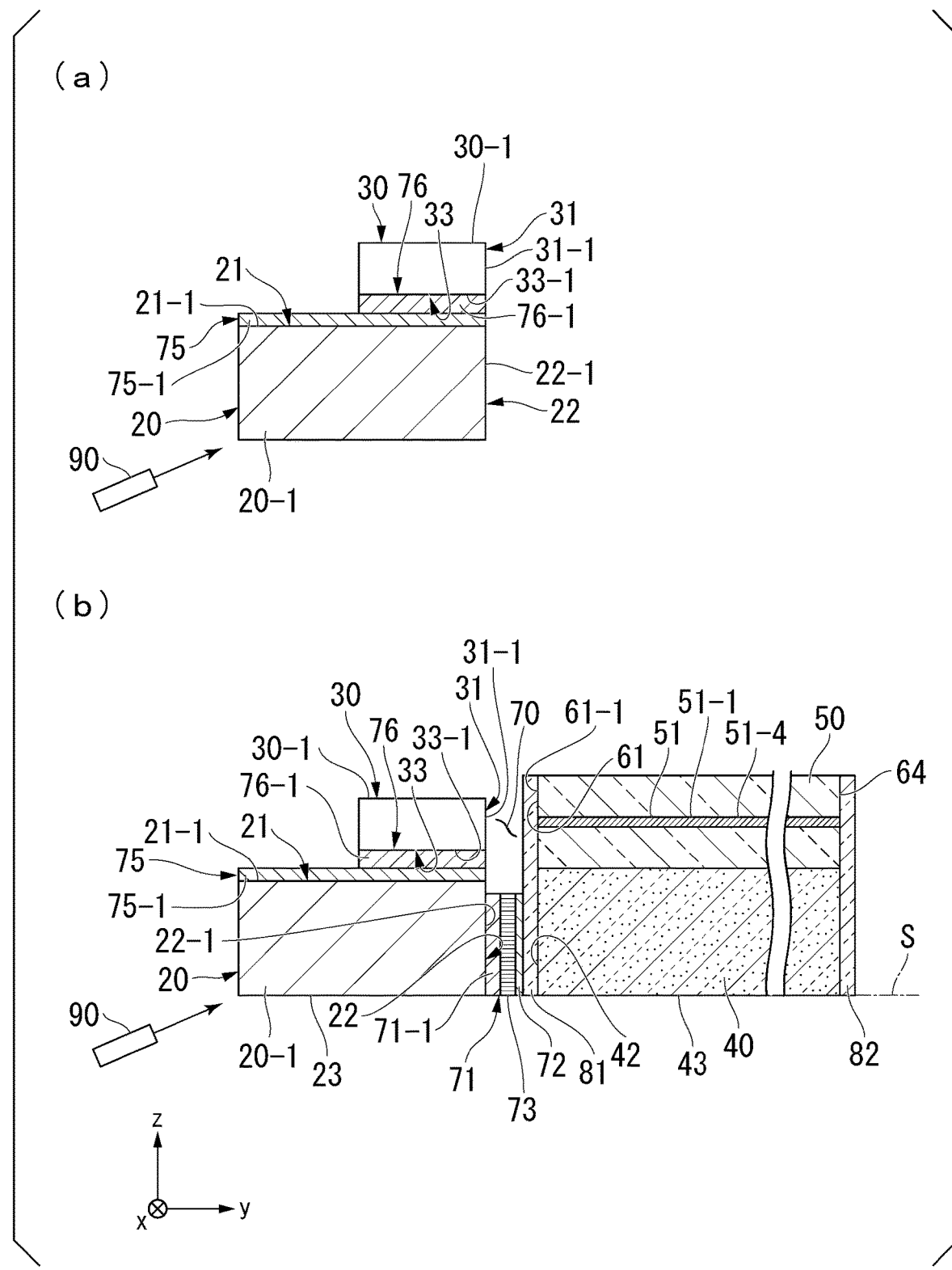
FIG. 5 is a cross-sectional view illustrating an example of a method for manufacturing the integrated optical device of the first embodiment.

Next, a method for manufacturing the integrated optical device 10 will be simply described. FIG. 5 is a diagram illustrating a method for manufacturing the integrated optical device 10. First, the LD 30 of the bare chip is mounted on the upper surface 21 of the subcarrier 20 by a known method. For example, the metal layer 75 is formed on the upper surface 21 of the subcarrier 20 by sputtering, vapor deposition, or the like. Further, the metal layer 76 is formed on a lower surface 33 of the LD 30 (for example, a lower surface 33-1 of the LD 30-1) by sputtering, vapor deposition, or the like. Next, as shown in FIG. 5(a), for example, the subcarrier 20 is irradiated with a laser beam from a laser 90 so that only the subcarrier 20 is heated to a degree that melting or deforming does not occur. Heat transfer from the subcarrier 20 softens or melts the metal layers 75 and 76 and then cools them. Accordingly, the LD 30 is bonded to the upper surface 21 of the subcarrier 20 through the metal layers 75 and 76. Further, the first metal layer 71 is formed on the side surface 22 of the subcarrier 20 by sputtering, vapor deposition, or the like before or after the LD 30 is mounted on the subcarrier 20.

Next, the PLC 50 is formed on the upper surface 41 of the substrate 40 by a known semiconductor process. Next, the antireflection films 81 and 82 and the antireflection film (not shown) are formed on the incident surface 61 and the emission surface 64. Further, the second metal layer 72 and the third metal layer 73 are formed in this order behind the antireflection film 81 in the y direction by sputtering, vapor deposition, or the like.

Next, the emission surface 31 and the incident surface 61 in the LDs 30 and the cores 51-1, 51-2, and 51-3 corresponding to each other in the x direction and the z direction are allowed to face each other in the y direction with a distance therebetween. The optical axis of each color light emitted from the LD 30 and the center of the incident surface 61 of the corresponding core are substantially overlapped with each other. At this time, the bottom surface 23 of the subcarrier 20 and the bottom surface 43 of the substrate 40 are arranged so that the bottom surface 23 of the subcarrier 20 and the bottom surface 43 of the substrate 40 are substantially on the same plane.

Next, as shown in FIG. 5(b), the subcarrier 20 is irradiated with a laser beam from the laser 90 to soften or melt the first metal layer 71, the second metal layer 72, and the third metal layer 73 due to the heat transfer from the subcarrier 20. The relative positions of the LD 30 and the PLC 50 are adjusted and the subcarrier 20 having the LD 30 mounted thereon is bonded to the substrate 40 provided with the PLC 50 so that the bottom surface 23 of the subcarrier 20 and the bottom surface 43 of the substrate 40 are substantially on the same plane. By these steps, it is possible to manufacture the integrated optical device 10 in which the bottom surface 23 of the subcarrier 20 and the bottom surface 43 of the substrate 40 are located on the substantially same plane.

(Integrated Optical Module)

Next, an integrated optical module including the integrated optical device of this embodiment will be described.

Figure 6:
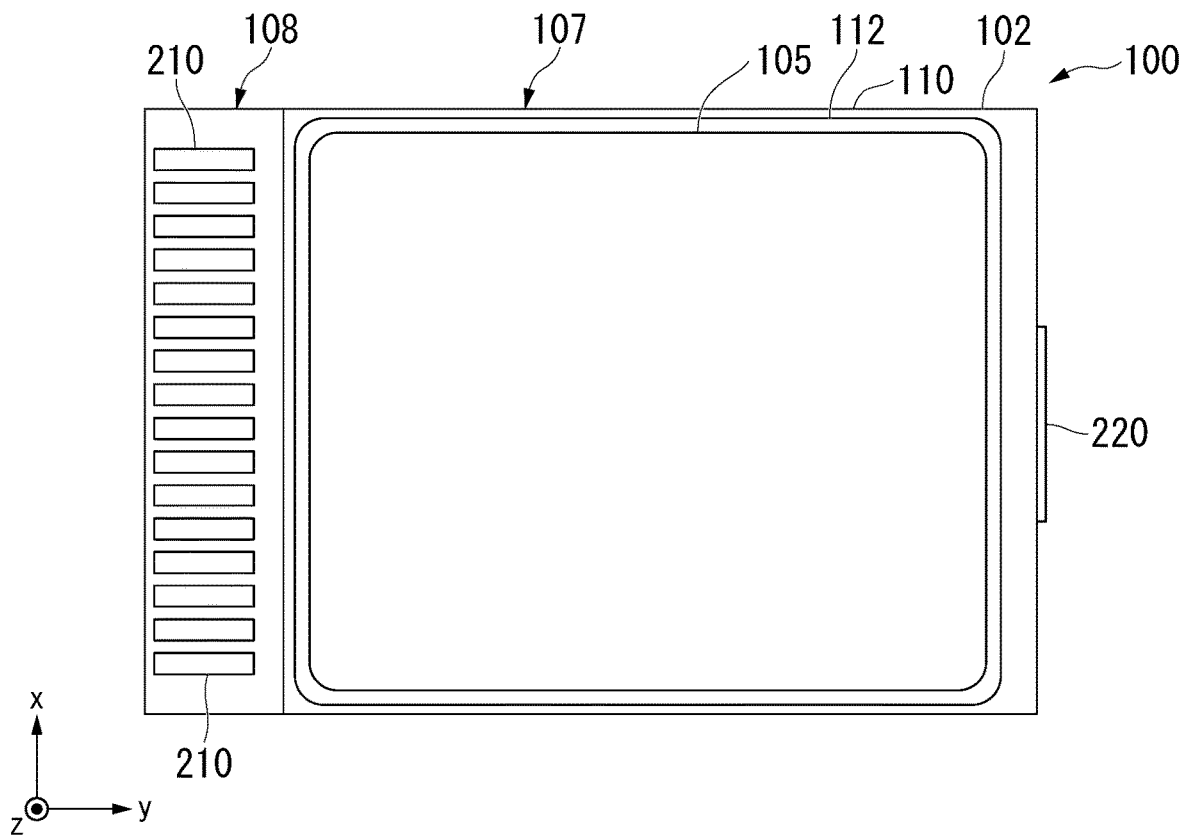
FIG. 6 is a plan view of an integrated optical module obtained by packaging the integrated optical device of the first embodiment.
Figure 7:
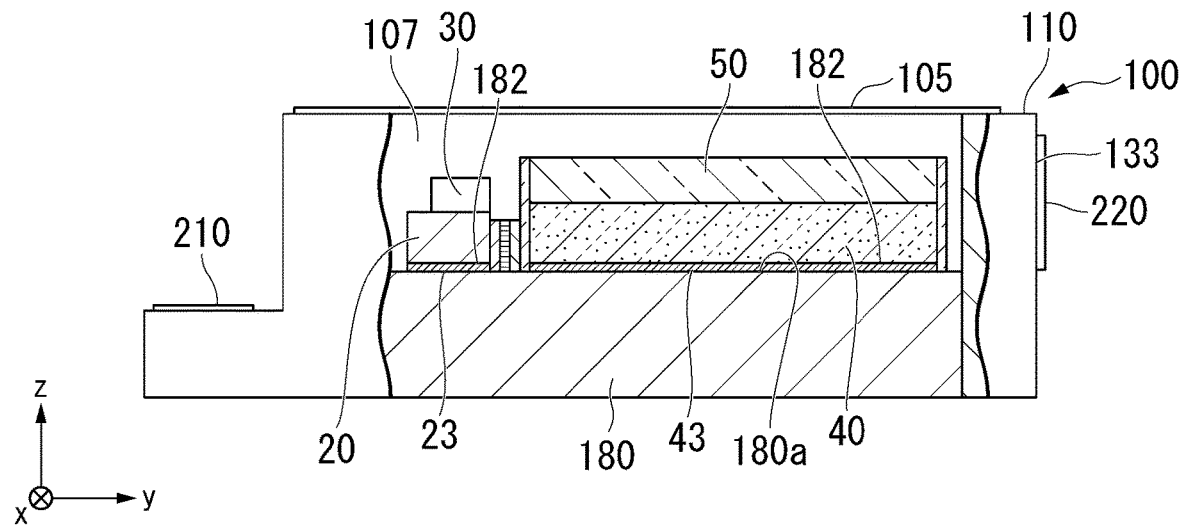
FIG. 7 is a side view of the integrated optical module.

An integrated optical module 100 of this embodiment may be accommodated in, for example, the package 110 as shown in FIGS. 6 and 7. The integrated optical module 100 includes the integrated optical device 10 and the package 110. The package 110 includes a main body 102 having a cavity structure and a cover 105 covering the main body 102.

The main body 102 includes a box-shaped accommodating portion 107 which accommodates the integrated optical device 10 and an electrode portion 108 which is adjacent to the accommodating portion 107. The main body 102 is made of, for example, ceramic or the like. An opening is formed on the upper surface of the accommodating portion 107. A metal film 112 such as Kovar is formed on the upper surface of the accommodating portion 107 at the periphery of the opening when viewed from above. The cover 105 completely covers the opening formed on the upper surface of the accommodating portion 107 via the metal film 112. When the accommodating portion 107 is hermetically sealed with the cover 105, an inert gas such as nitrogen ($N_2$) is enclosed in the internal space of the accommodating portion 107. That is, the accommodating portion 107 is hermetically sealed by the cover 105. The internal space of the accommodating portion 107 is filled with an inert gas. Accordingly, the gap 70 (see FIG. 4) is filled with an inert gas.

The electrode portion 108 is disposed on the front side of the accommodating portion 107 in the y direction, that is, on the rear side in the y direction. The upper surface of the electrode portion 108 is located below the upper surface of the accommodating portion 107. The bottom surface of the electrode portion 108 is located at the substantially same height as the bottom surface of the accommodating portion 107. A plurality of external electrode pads 210 are provided on the electrode portion 108 at intervals in the x direction.

Figure 8:
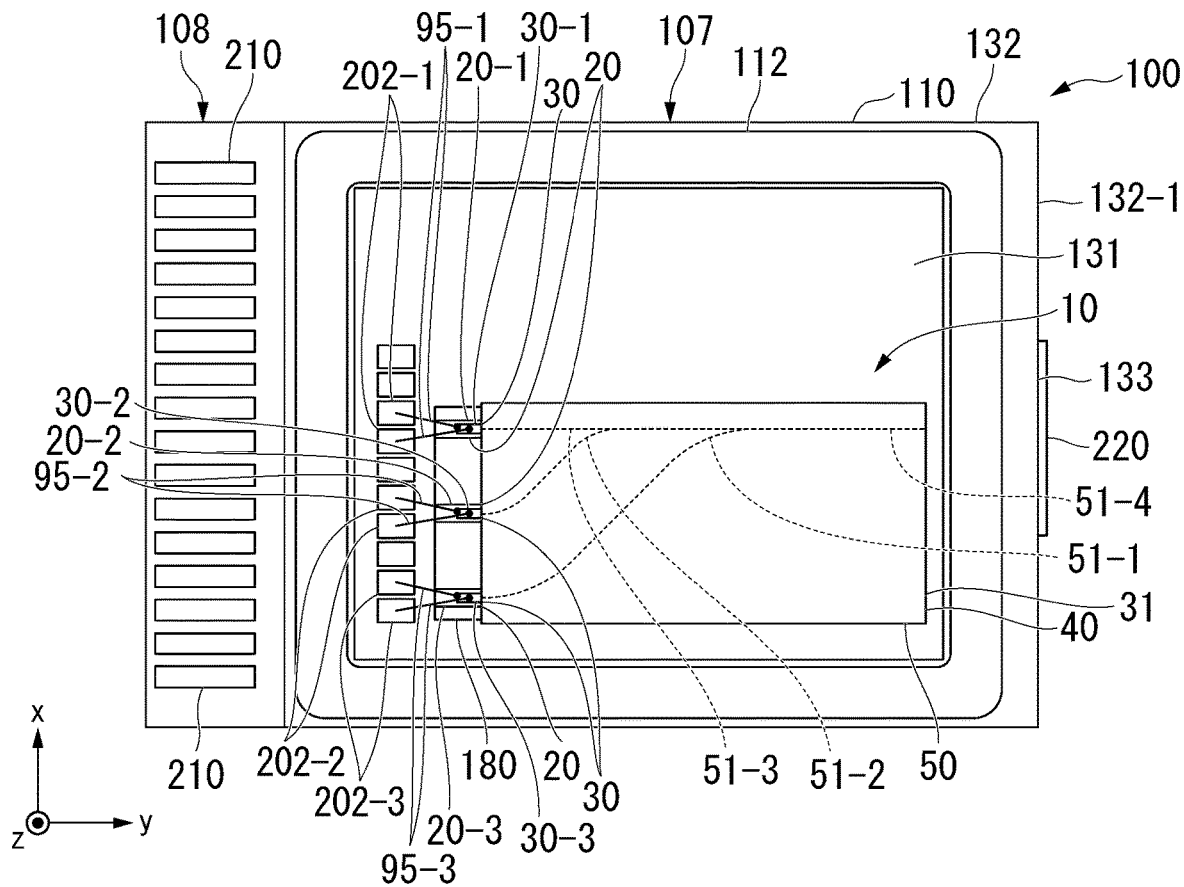
FIG. 8 is a plan view in a state in which a cover of the integrated optical module is excluded.
Figure 9:
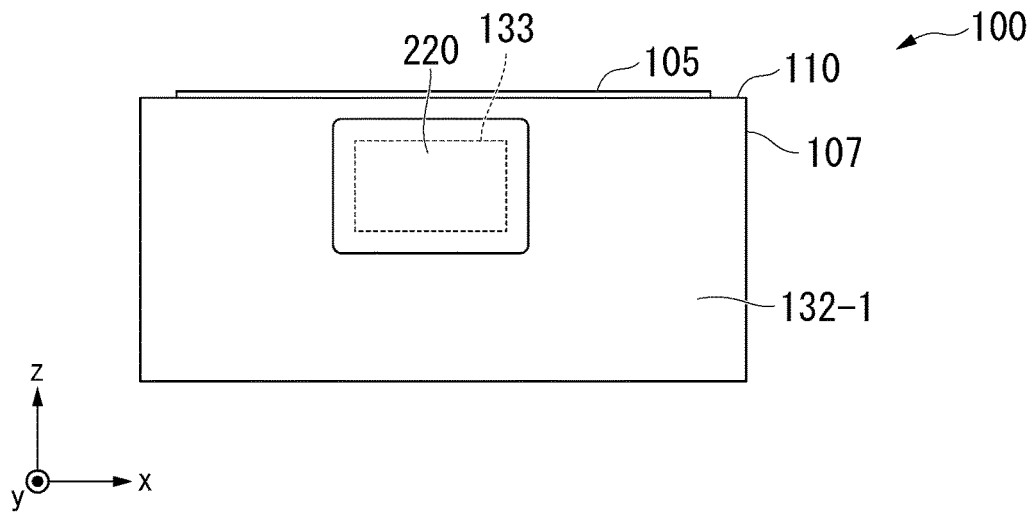
FIG. 9 is a side view of the integrated optical module as viewed from an emitting portion side.
Figure 10:
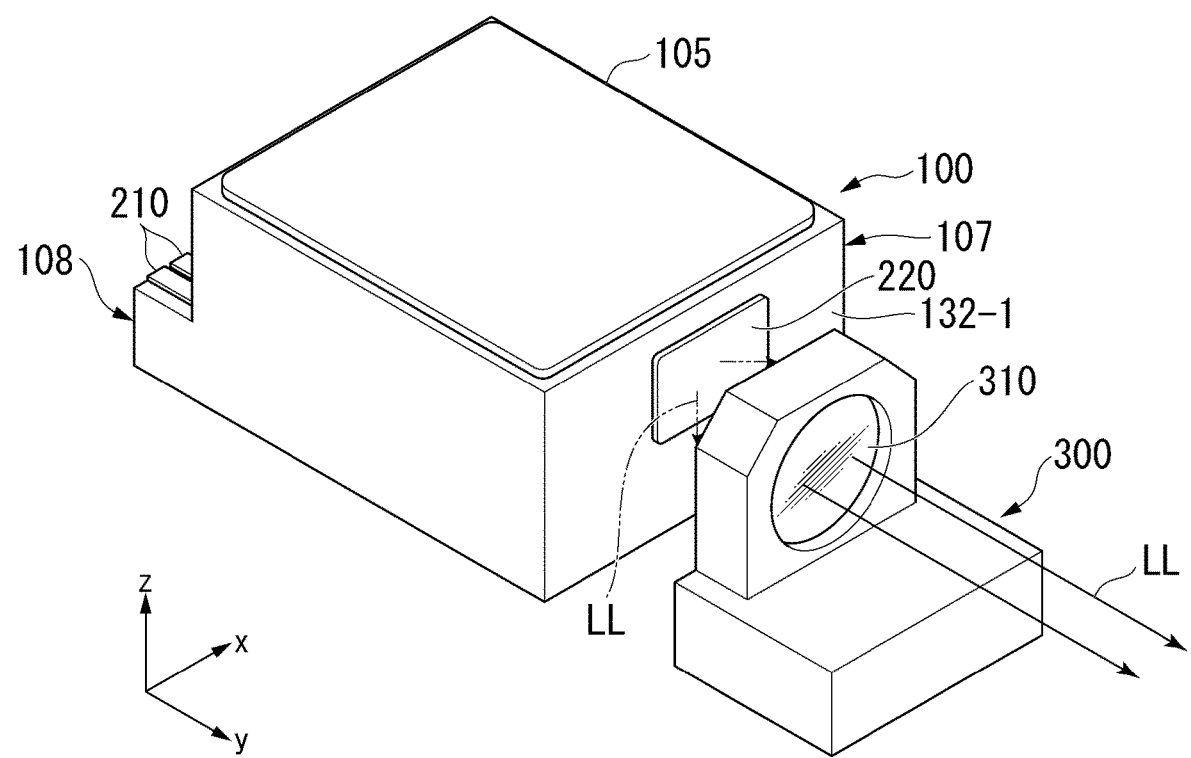
FIG. 10 is a perspective view showing a state when the integrated optical module is used.

As shown in FIGS. 7 and 8, the base 180 for installing the integrated optical device 10 is provided at a predetermined position of a bottom wall portion 131 of the accommodating portion 107. The integrated optical device 10 is provided on the base 180. That is, the integrated optical device 10 is disposed in the internal space of the accommodating portion 107. In the integrated optical device 10, since the bottom surface (mounting base bottom surface) 23 of the subcarrier (mounting base) 20 and the bottom surface (substrate bottom surface) 43 of the substrate 40 are formed to be located on the substantially same plane S, both the subcarrier 20 and the substrate 40 of the integrated optical device 10 are bonded to an upper surface 180a (one inner surface) of the base 180.

The bottom surface (mounting base bottom surface) 23 of the subcarrier (mounting base) 20 and the bottom surface (substrate bottom surface) 43 of the substrate 40 may be bonded through an adhesive layer 182 with respect to the upper surface 180a (one inner surface) of the base 180. The adhesive layer 182 is made of a material in which a filler is mixed with a resin in order to enhance thermal conductivity. Examples of the resin constituting the adhesive layer 182 include an epoxy resin. Further, as the filler for improving the thermal conductivity of the resin, copper powder, aluminum powder, alumina powder or the like can be used.

Additionally, in order to maintain a certain level of thermal conductivity or more of the adhesive layer 182, the thermal conductivity is preferably 0.5 W/m·K or more, more preferably 1 W/m·K or more, and particularly preferably 4 W/m·K or more.

In this way, since both the substrate 40 and the subcarrier (mounting base) 20 of the integrated optical device 10 are bonded to the upper surface 180a of the base 180 of the package 110, heat generated by the operation of the LD 30 can be efficiently dissipated from both the bottom surface (mounting base bottom surface) 23 of the subcarrier (mounting base) 20 and the bottom surface (substrate bottom surface) 43 of the substrate 40 toward the base 180. Further, since both the bottom surface (mounting base bottom surface) 23 of the subcarrier (mounting base) 20 and the bottom surface (substrate bottom surface) 43 of the substrate 40 are bonded by an adhesive layer made of a resin mixed with a filler, heat can be efficiently propagated from both the bottom surface (mounting base bottom surface) 23 of the subcarrier (mounting base) 20 and the bottom surface (substrate bottom surface) 43 of the substrate 40 toward the base 180.

The plurality of internal electrode pads 202 are provided at intervals in the x direction in the bottom wall portion 131 between the external electrode pad 210 and the base 180 below the subcarrier 20 in the y direction.

Each of the LD 30 and the subcarrier 20 is connected to the internal electrode pad 202 corresponding to each LD 30 in the plurality of internal electrode pads 202 by a method such as wire-bonding using the wire 95. For example, each of the LD 30-1 and the subcarrier 20-1 is individually connected to each of two internal electrode pads 202-1 by a wire 95-1. Each of the LD 30-2 and the subcarrier 20-2 is individually connected to each of two internal electrode pads 202-2 by a wire 95-2. Each of the LD 30-3 and the subcarrier 20-3 is individually connected to each of two internal electrode pads 202-3 by a wire 95-3.

The internal electrode pads 202-1, 202-2, and 202-3 are each connected to different external electrode pads 210. As described above, the external electrode pad 210 electrically connected to each of the internal electrode pads 202-1, 202-2, and 202-3 is electrically connected to a power supply (not shown) or the like. That is, in the integrated optical device 10, the LD 30 and the power supply (not shown) are connected by the wire 95, the internal electrode pads 202-1, 202-2, and 202-3, and the external electrode pad 210. When electric power is supplied from the power supply (not shown) to the external electrode pad 210 corresponding to each of the internal electrode pads 202-1, 202-2, and 202-3, the red light, the green light, and the blue light are emitted from the LDs 30-1, 30-2, and 30-3.

Figure 12:
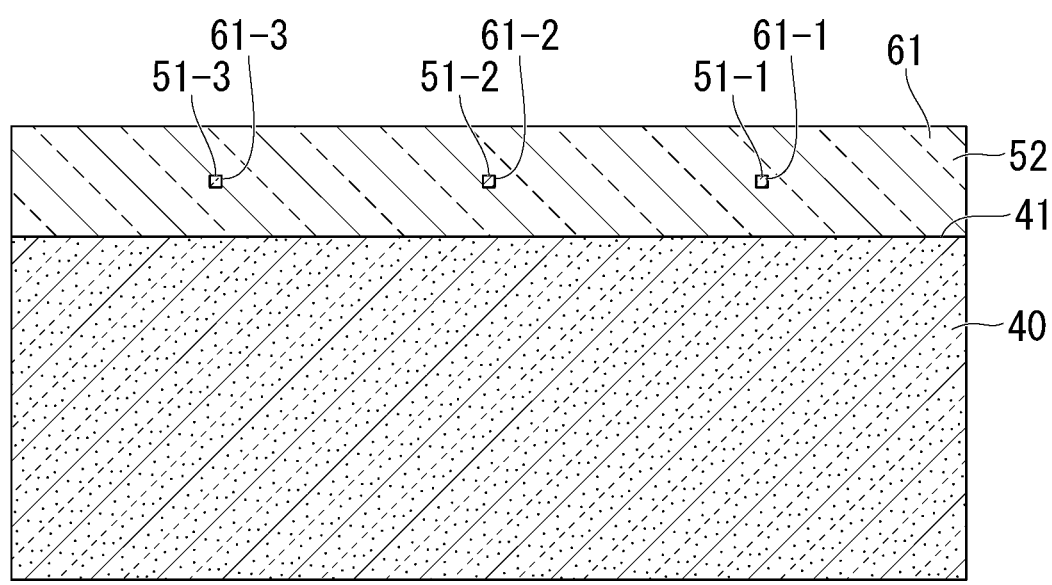
FIG. 12 is a cross-sectional view of an incident surface of a PLC of the integrated optical device of the second embodiment.
Figure 13:
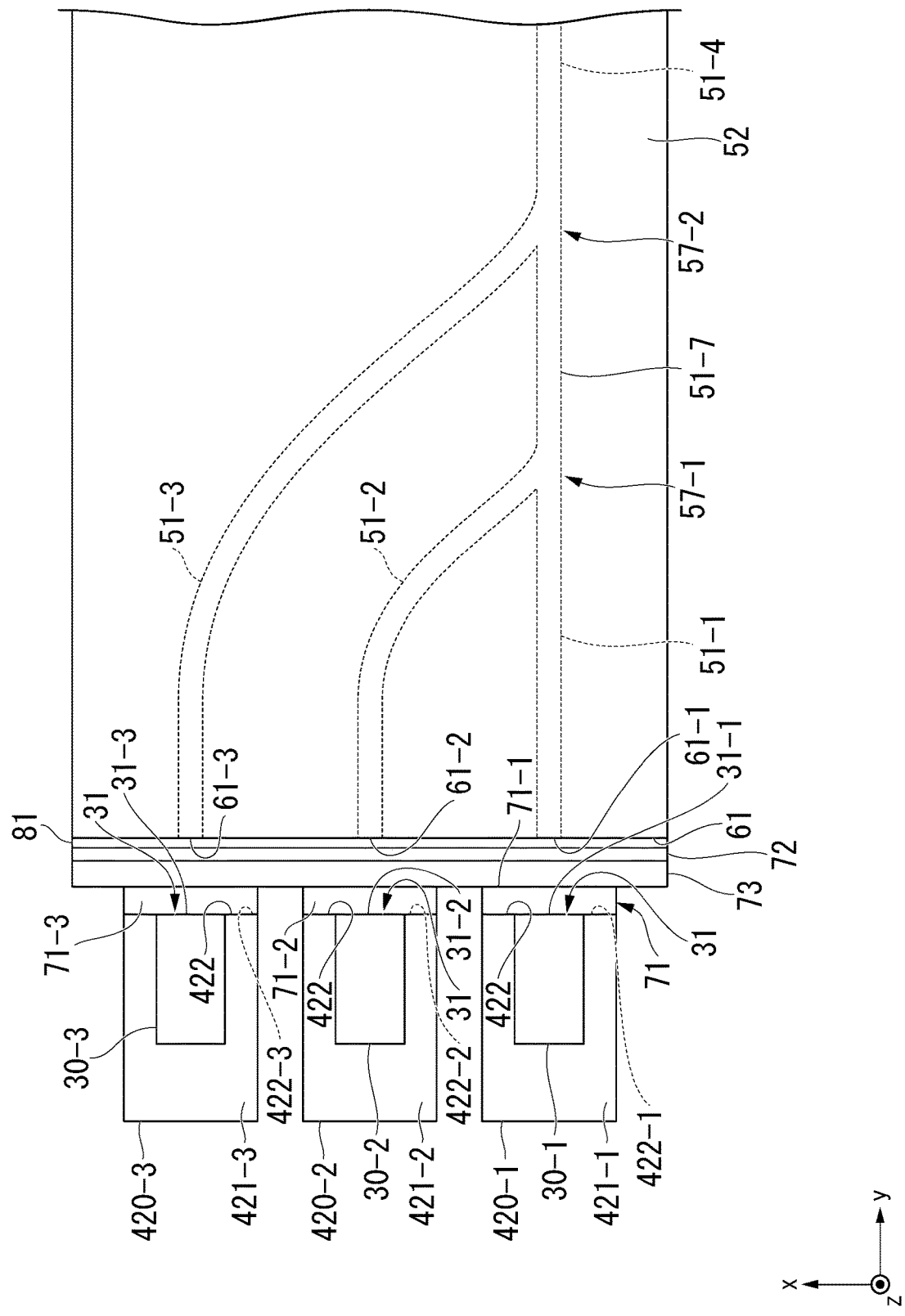
FIG. 13 is a plan view of a part of the integrated optical device of the second embodiment.

In a side wall portion 132 of the accommodating portion 107, the side wall portion 132 facing the emission surface 31 of the PLC 50 of the integrated optical device 10 is provided with an opening 133. The opening 133 is formed substantially around a position intersecting the optical axis of the three-color light emitted from the core 51-4 of the PLC 50 on the side wall portion 132. The opening 133 is formed to be larger than the size on the surface of the side wall portion 132 of the three-color light emitted from the core 51-4 and spread in the internal space of the accommodating portion 107. As shown in FIGS. 12 and 13, the opening 133 is covered by a glass plate 220 from the outside of the side wall portion 132 without any gap. That is, the accommodating portion 107 is hermetically sealed by the glass plate 220 in addition to the cover 105. Antireflection films (not shown) are provided on both surfaces of the glass plate 220.

Figure 14:
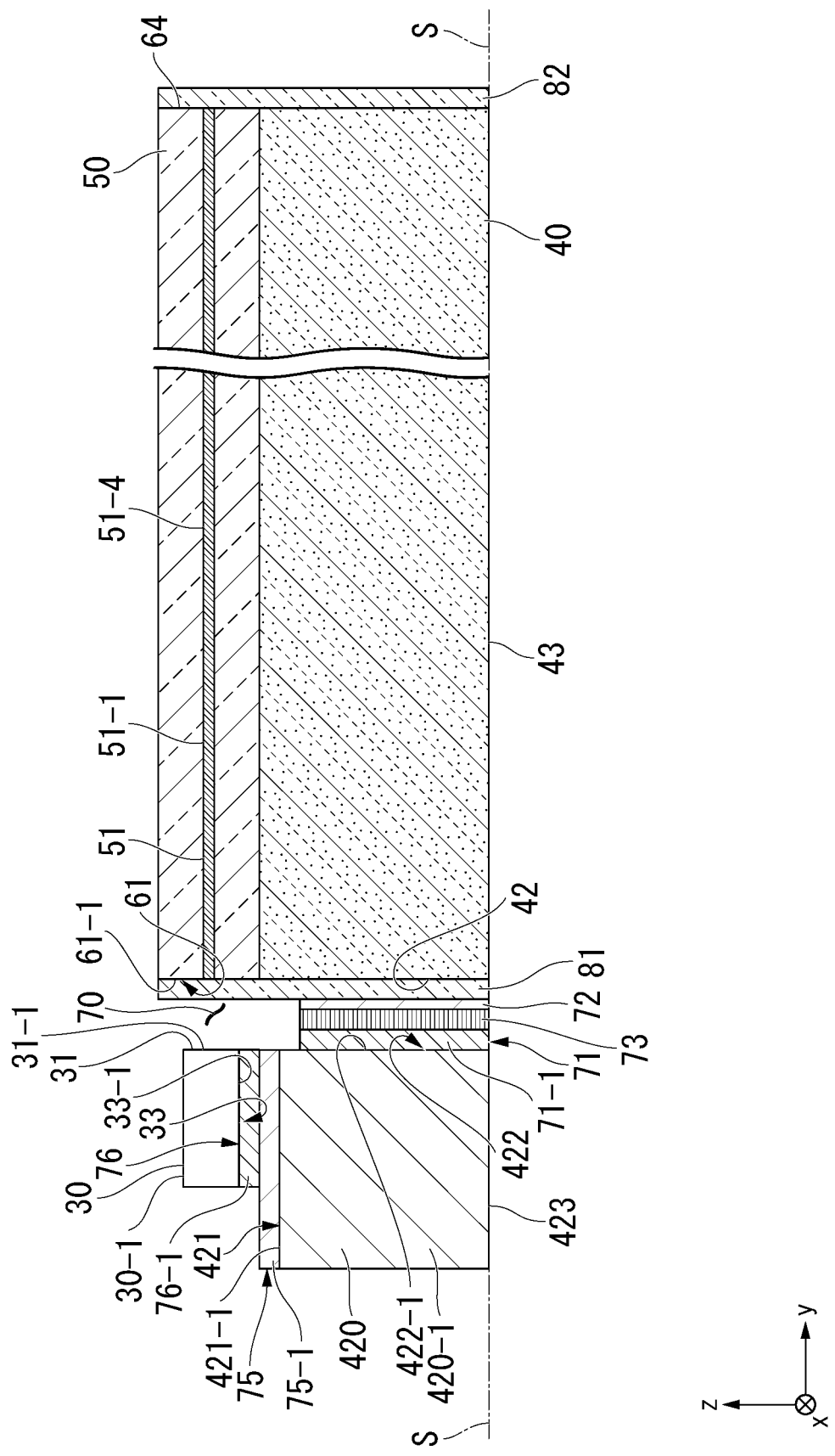
FIG. 14 is a cross-sectional view taken along a line B-B' of the integrated optical device of the second embodiment.

The opening 133 is a window through which the three-color light emitted from the core 51-4 of the PLC 50 passes and propagates to the outside of the package 110. As shown in FIG. 14, the three-color light LL emitted from the core 51-4 of the PLC 50 passes through the opening 133 and the glass plate 220 while diffusing around the y direction and travels in the y direction of the package 110 to the inside, that is, to the front side in the y direction. For example, a collimating device 300 including a collimating lens 310 can be disposed on the inside of a side wall portion 132-1 of the package 110 in the y direction. The three-color light LL emitted from the core 51-4 is collimated to become parallel light by aligning the distance between the emission surface 31 and the collimating lens 310 in the y direction with the focal length of the collimating lens 310 and aligning the center of the collimating lens 310 on the optical axis of the three-color light LL.

Second Embodiment (Integrated Optical Device)

Figure 11:
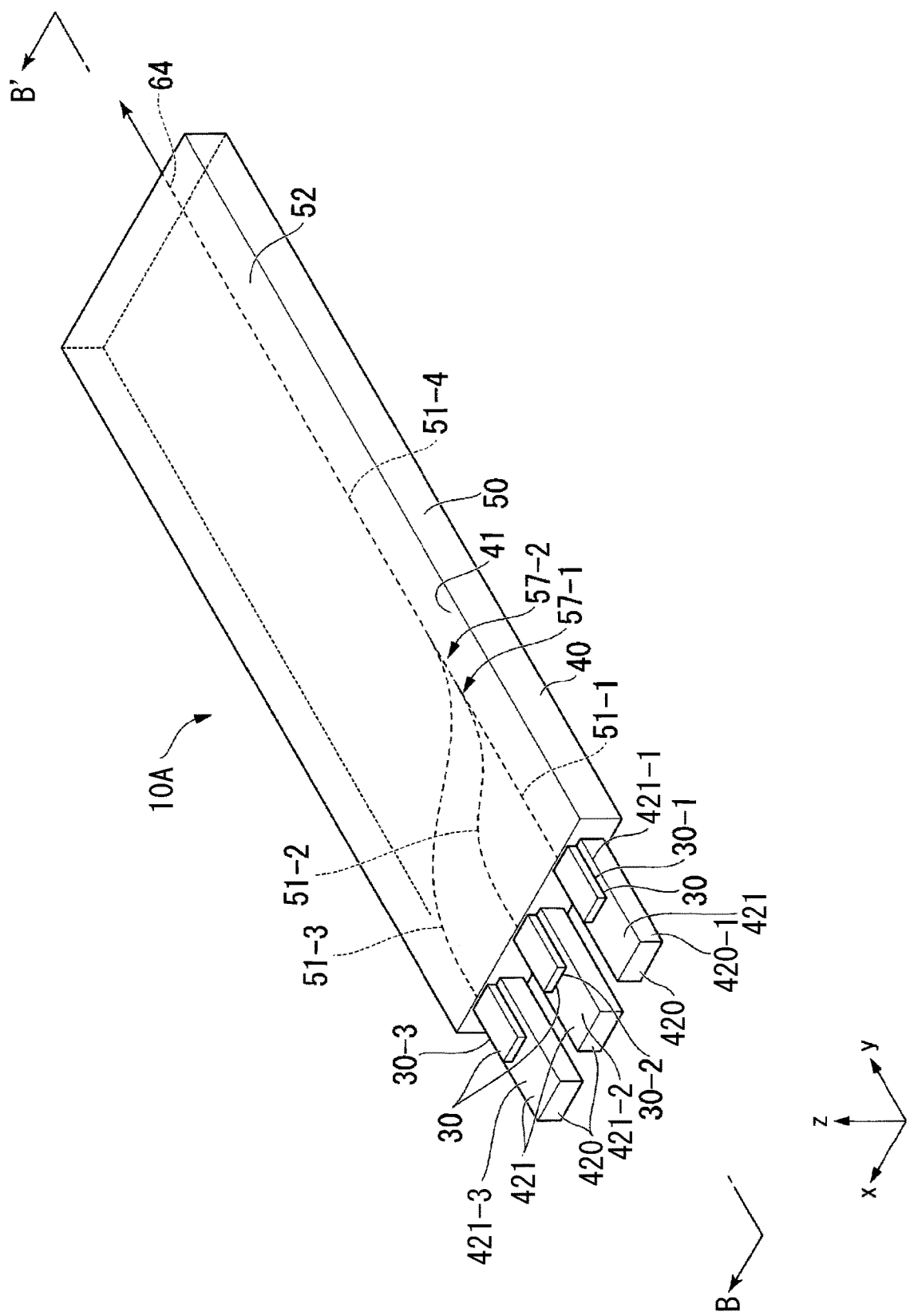
FIG. 11 is a perspective view of an integrated optical device of a second embodiment.
Figure 15:
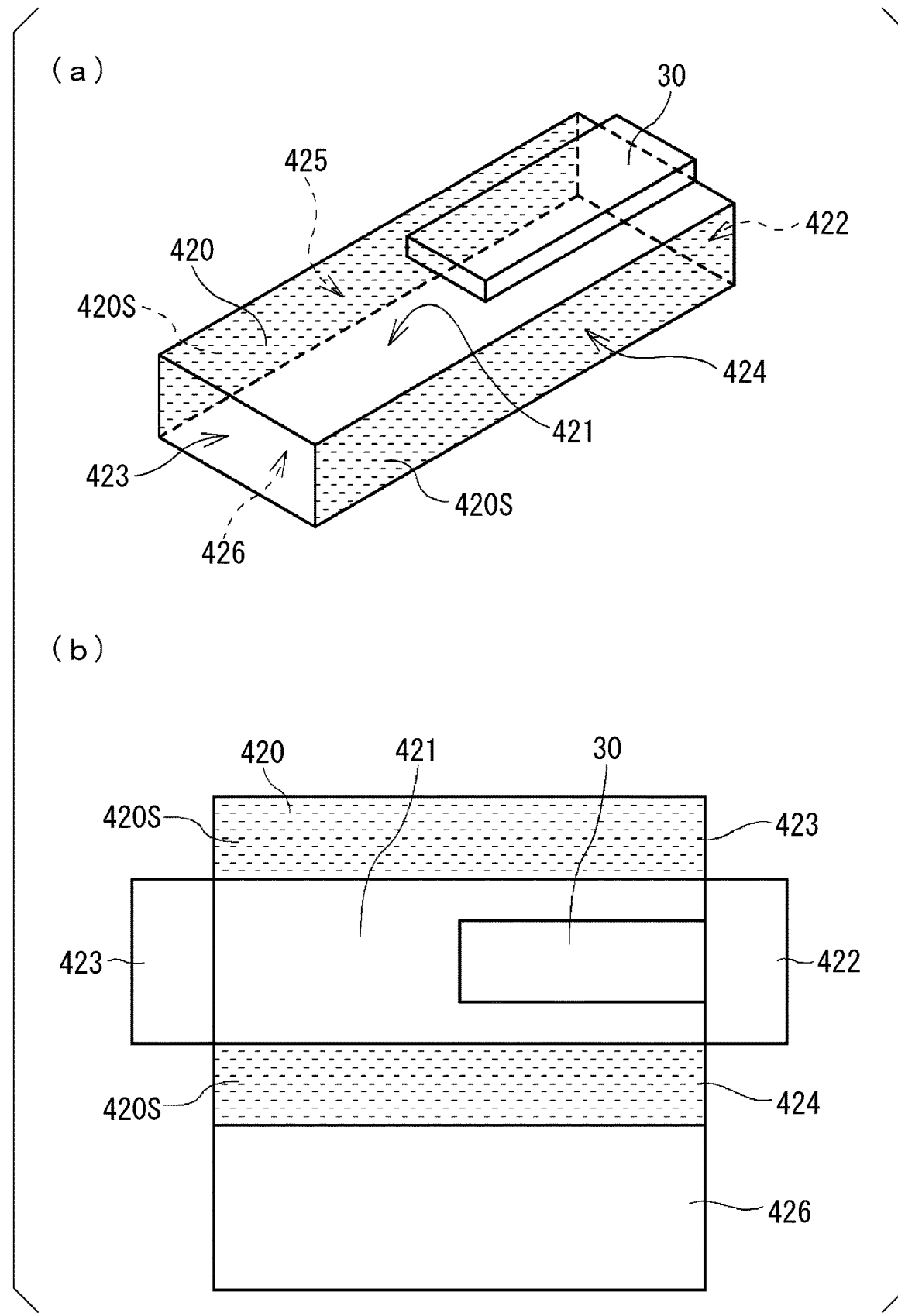
FIG. 15 is a diagram illustrating the surface roughness of each surface of a subcarrier.

FIGS. 11 to 14 are diagrams illustrating an integrated optical device 10A according to a second embodiment. FIG. 11 is a perspective view of the integrated optical device 10A. FIG. 12 is a cross-sectional view of the incident surface 61 of the PLC 50 of the integrated optical device 10A shown in FIG. 11. FIG. 13 is a plan view of a part of the integrated optical device 10A shown in FIG. 11. FIG. 14 is a cross-sectional view taken along a line B-B' of the integrated optical device 10A shown in FIG. 11. FIG. 15 is a diagram illustrating the surface roughness of each surface of the subcarrier 20. In the integrated optical device 10A according to the second embodiment, a configuration of a subcarrier 420 is different from that of the subcarrier 20 of the integrated optical device 10 according to the first embodiment. In the integrated optical device 10A, the same configurations as those of the integrated optical device 10 are designated by the same reference numerals, and the description thereof may be omitted.

As shown in FIG. 11, the integrated optical device 10A according to this embodiment includes the subcarrier (mounting base) 420, the optical semiconductor device (LD) 30 provided on an upper surface 421 of the subcarrier 420, the substrate 40, and the optical waveguide device (PLC) 50 provided on the upper surface 41 of the substrate 40.

The integrated optical device 10A is a combiner that combines light of each of the three primary colors of light, red (R), green (G), and blue (B). Therefore, the integrated optical device 10A includes the LD 30-1 that emits red light, the LD 30-2 that emits green light, and the LD 30-3 that emits blue light. Such an integrated optical device 10A can be applied as a combiner mounted on, for example, a head-mounted display or smart glasses. In this embodiment, the red light means light having a peak wavelength of 690 nm or more and 710 nm or less. The green light means light having a peak wavelength of 535 nm or more and 555 nm or less. The blue light means light having a peak wavelength of 425 nm or more and 445 nm or less.

The LDs 30-1, 30-2, and 30-3 are arranged at intervals in a direction substantially orthogonal to the emission direction of the light emitted from each LD and are provided on the upper surface 421 of the individual subcarrier 420. The LD 30-1 is provided on an upper surface 421-1 of a subcarrier 420-1. The LD 30-2 is provided on an upper surface 421-2 of a subcarrier 420-2. The LD 30-3 is provided on an upper surface 421-3 of a subcarrier 420-3. Hereinafter, in the reference numeral Z of any component of the integrated optical device 10A, the contents common to the components of the reference numerals Z-1, Z-2, . . . , Z-K may be collectively referred to as the reference numeral Z. K is a natural number of 2 or more.

The LD 30 is a bare chip mounted on the subcarrier 420. The subcarrier 420 is made of, for example, aluminum nitride (AlN), aluminum oxide (Al$_2$O$_3$), silicon (Si), or the like. As shown in FIG. 14, the metal layers 75 and 76 are provided between the subcarrier 420 and the LD 30. The subcarrier 420 and the LD 30 are connected to each other through the metal layers 75 and 76.

As a method of forming the metal layers 75 and 76, a known method can be used and is not particularly limited, but a known method such as sputtering, vapor deposition, or coating of a paste-like metal can be used. The metal layers 75 and 76 contain one or more metals selected from the group composed of, for example, gold (Au), platinum (Pt), silver (Ag), lead (Pb), indium (In), nickel (Ni), titanium (Ti), tantalum (Ta), tungsten (W), an alloy of gold (Au) and tin (Sn), tin (Sn)-silver (Ag)-copper (Cu)-based solder alloys (SAC), SnCu, InBi, SnPdAg, SnBiIn, and PbBiIn.

The substrate 40 is made of silicon (Si). The PLC 50 is manufactured to be integrated with the substrate 40 on the upper surface 41 by a semiconductor process including known photolithography and dry etching used when forming a fine structure such as an integrated circuit. As shown in FIGS. 11 and 12, the PLC 50 is provided with as many cores 51-1, 51-2, and 51-3 as the LDs 30-1, 30-2, and 30-3 constituting the optical waveguide and a clad 52 surrounding the cores 51-1, 51-2, and 51-3. The thickness of the clad 52 and the widthwise dimensions of the cores 51-1, 51-2, and 51-3 are not particularly limited. For example, the cores 51-1, 51-2, 51-3 having widthwise dimensions of about several microns are arranged in the clad 52 having a thickness of about 50 μm.

The cores 51-1, 51-2, and 51-3 and the clad 52 are made of, for example, quartz. The refractive index of the cores 51-1, 51-2, and 51-3 is higher than the refractive index of the clad 52 by a predetermined value. Accordingly, the light incident on each of the cores 51-1, 51-2, and 51-3 propagates through each core while being totally reflected at the interface between each core and the clad 52. The cores 51-1, 51-2, and 51-3 are doped with impurities such as germanium (Ge) in an amount corresponding to the above-described predetermined values.

Hereinafter, the emission direction of the light emitted from the LD 30 is the y direction. The direction which is orthogonal to the y direction in the plan including the y direction and in which the LDs 30-1, 30-2, and 30-3 are arranged at intervals is the x direction. The direction orthogonal to the x direction and the y direction and directed from the subcarrier 420 to the LD 30 is the z direction. In an incident surface 61 of the PLC 50, the cores 51-1, 51-2, and 51-3 are arranged to match the optical axis of the light emitted from the LDs 30-1, 30-2, and 30-3 in the x direction and the z direction.

As shown in FIGS. 11 and 13, the cores 51-1, 51-2, and 51-3 are gathered together on the front side reaching the emission surface 64 of the PLC 50. That is, the cores 51-1, 51-2, and 51-3 approach each other sequentially toward the front side in the y direction and merge with one core 51-4. It is preferable that each of the cores 51-1, 51-2, and 51-3 be connected to the core 51-4 at a curvature radius equal to or larger than a predetermined curvature radius so that light does not leak from the cores 51-1, 51-2, and 51-3.

As shown in FIG. 13, the incident surface 61 of the PLC 50 is disposed to face the emission surface 31 of the LD 30. Specifically, the emission surface 31-1 of the LD 30-1 faces the incident surface 61-1 of the core 51-1. In the x direction and the z direction, the optical axis of the red light emitted from the LD 30-1 substantially overlaps with the center of the incident surface 61-1. The emission surface 31-2 of the LD 30-2 faces the incident surface 61-2 of the core 51-2. In the x direction and the z direction, the optical axis of the green light emitted from the LD 30-2 substantially overlaps with the center of the incident surface 61-2. The emission surface 31-3 of the LD 30-3 faces the incident surface 61-3 of the core 51-3. In the x direction and the z direction, the optical axis of the blue light emitted from the LD 30-3 substantially overlaps with the center of the incident surface 61-3. With such a configuration and arrangement, at least a part of the red light, the green light, and the blue light emitted from the LDs 30-1, 30-2, and 30-3 can be incident to the cores 51-1, 51-2, and 51-3.

As shown in FIG. 11, the red light, the green light, and the blue light emitted from the LDs 30-1, 30-2, and 30-3 are respectively incident to the cores 51-1, 51-2, and 51-3 and propagate through the cores. The cores 51-1 and 51-2 and the red light and the green light propagated through these cores merge at a predetermined merging position 57-1 (see FIG. 13) behind a merging position 57-2 in the y direction. The core 51-7 (see FIG. 13) at which the cores 51-1 and 51-2 merge with each other, the core 51-3, and the red light, the green light and the blue light propagating through these core meet at a merging position 57-2. The red light, the green light, and the blue light collected at the merging position 57-2 propagate through the core 51-4 and reach the emission surface 64. The three-color light emitted from the emission surface 64 is used, for example, as signal light or the like depending on the purpose of use of the integrated optical device 10A.

As shown in FIG. 14, the subcarrier 420 is connected to the substrate 40 through the first metal layer 71, the second metal layer 72, and the third metal layer 73. In this embodiment, a side surface (first side surface) 422 (422-1, 422-1, 422-3) of the subcarrier 420 facing the substrate 40 is connected to the side surface 42 of the substrate 40 through the first metal layer 71, the second metal layer 72, the third metal layer 73, and the antireflection film 81. The melting point of the metal layer 75 is higher than the melting point of the third metal layer 73.

The first metal layer 71 is provided while being in contact with a first side surface 422 by sputtering, vapor deposition, or the like and is made of one or more metals selected from the group composed of, for example, gold (Au), platinum (Pt), silver (Ag), lead (Pb), indium (In), nickel (Ni), titanium (Ti), and tantalum (Ta). Preferably, gold (Au), platinum (Pt), silver (Ag), lead (Pb), indium (In), and nickel (Ni) are used for the first metal layer 71. The second metal layer 72 is provided while being in contact with a side surface 42 by sputtering, vapor deposition, or the like and is made of one or more metals selected from the group composed of, for example, titanium (Ti), tantalum (Ta), and tungsten (W). Preferably, tantalum (Ta) is used for the second metal layer 72. The third metal layer 73 is interposed between the first metal layer 71 and the second metal layer 72 and is made of one or more metals selected from the group composed of, for example, aluminum (Al), copper (Cu), AuSn, SnCu, InBi, SnAgCu, SnPdAg, SnBiIn, and PbBiIn. Preferably, AuSn, SnAgCu, and SnBiIn are used for the third metal layer 73.

The thickness of the first metal layer 71, that is, the size of the first metal layer 71 in the y direction is, for example, 0.01 μm or more and 5.00 μm or less. The thickness of the second metal layer 72, that is, the size of the second metal layer 72 in the y direction is, for example, 0.01 μm or more and 1.00 μm or less. The thickness of the third metal layer 73, that is, the size thereof in the y direction is, for example 0.01 μm or more and 5.00 μm or less. Further, it is preferable that the thickness of the third metal layer 73 be larger than the thickness of each of the first metal layer 71 and the second metal layer 72. In such a configuration, each of the above-described roles of the first metal layer 71, the second metal layer 72, the third metal layer 73 is well expressed and the entry of the material of the first metal layer 71 into the substrate 40 and the decrease in the adhesive strength between the metal layers are suppressed.

In this embodiment, the first metal layer 71 is provided on the side surface facing the PLC 50 or the substrate 40 in the substantially entire area of the first side surface 422 while not being in contact with the metal layer 75. The front ends, that is, the upper ends of the second metal layer 72 and the third metal layer 73 in the z direction reach the same position as the upper end of the first metal layer 71 on the front side in the z direction. The rear ends, that is, the lower ends of the second metal layer 72 and the third metal layer 73 in the z direction reach the same positions as the lower ends of the metal layer 71, the subcarrier 420, and the substrate 40. When viewed from the y direction, the first metal layer 71 is formed to be larger than the subcarrier 420 in the x direction.

As in the above-described configuration, it is preferable that the area of the first metal layer 71, that is, the size thereof in the plane including the x direction and the z direction be substantially the same as the area of the second metal layer 72 and the third metal layer 73 and the lower end thereof reach the same position as the lower end of the subcarrier 20. In such a configuration, the connection strength of the subcarrier 420 to the substrate 40 is secured to the maximum. In addition, the lower ends of the first metal layer 71, the second metal layer 72, and the third metal layer 73 may be located above the lower ends of the subcarrier 420 and the substrate 40.

In this embodiment, the antireflection film 81 is provided between the LD 30 and the PLC 50. For example, the antireflection film 81 is integrally formed with the side surface 42 of the substrate 40 and the incident surface 61 of the PLC 50. However, the antireflection film 81 may be formed only on the incident surface 61 of the PLC 50.

The antireflection film 82 is also formed on the emission surface 64 in addition to the incident surface 61. Additionally, the antireflection film (not shown) is also provided on the emission surface 64. Additionally, FIG. 11 shows a schematic configuration of the integrated optical device 10A and the first metal layer 71, the second metal layer 72, the third metal layer 73, and the antireflection films 81 and 82 are omitted.

The antireflection films 81 and 82 are films for preventing the light incident to or emitted from the PLC 50 from being reflected from the incident surface 61 or the emission surface 64 in the direction opposite to the direction in which the light is incident to each surface and increasing the transmittance of the incident light or emitted light. The antireflection films 81 and 82 are multilayer films formed by alternately laminating, for example, a plurality of types of dielectrics corresponding to the wavelengths of the red light, the green light, and the blue light which are the incident light in a predetermined thickness. Examples of the above-described dielectric include titanium oxide ($TiO_2$), silicon oxide ($SiO_2$), aluminum oxide ($Al_2O_3$), and the like.

FIG. 15 is a diagram illustrating the surface roughness of each surface of the subcarrier 420.

As shown in FIG. 15, the subcarrier 420 has a substantially rectangular parallelepiped shape and includes the upper surface 421 which constitutes a mounting surface of the LD 30, the first side surface 422 which is connected to the side surface of the substrate 40 through the metal layers 71, 73, and 72, a second side surface 423 which is on the side opposite to the first side surface 422, a third side surface 424 and a fourth side surface 425 which are respectively adjacent to the first side surface 422 and the second side surface 423 to face them, and a bottom surface (mounting base bottom surface) 26 which is on the side opposite to the upper surface 421. The LD 30 is disposed closer to the first side surface 422 of the subcarrier 420 (that is, the front end portion of the upper surface 421) and is connected to the subcarrier 420 through the metal layers 75 and 76.

In this embodiment, the upper surface 421, the first side surface 422, the second side surface 423, and the bottom surface 26 of the subcarrier 420 are smooth surfaces, but the entire surfaces of the third side surface 424 and the fourth side surface 425 are provided with a roughened region 420S. The roughened region 420S is a region in which the surface roughness is larger than that of the smooth surface such as the upper surface 421 of the subcarrier 420. Specifically, the maximum cross-sectional height (Rt) of the smooth surface such as the upper surface 421 of the subcarrier 420 is 0.01 μm or more and 5 μm or less, but the maximum cross-sectional height (Rt) of the roughened region 420S is 5 μm or more and 50 μm or less. The maximum cross-sectional height (Rt) of the roughened region 420S may be 10 μm or more and 50 μm or less, 20 μm or more and 40 μm or less, and preferably 5 μm or more and 30 μm or less.

In the present specification, the "maximum cross-sectional height" means the sum of the maximum value of the peak height and the maximum value of the valley depth of the contour curve in the evaluation length in accordance with JIS B601.

The maximum cross-sectional height (Rt) of the roughened region 420S of the subcarrier 420 is measured non-contactly by a method using a device of the same principle as a white light interference type microscope (for example, "Wyko-HD9800" manufactured by BRUKER).

The samples 1 to 5 shown in Table 1 are examples in which the maximum cross-sectional height (Rt) of the surface before and after performing a roughening treatment on the surface of the subcarrier made of silicon by sandblasting is measured by a white light interference type microscope ("Wyko-HD9800" manufactured by BRUKER). The measurement used a VSI mode, the Rt before the roughening treatment was measured at a magnification of 7.5 times and a measurement range of (400) μm×(400) μm, and the Rt after the roughening treatment was measured at a magnification of 10 times and a measurement range of (400) μm×(400) μm.

TABLE 1

|  | Rt (μm) before roughening | Rt (μm) after roughening |
|---|---|---|
| Sample 1 | 0.82 | 11.60 |
| Sample 2 | 1.51 | 7.36 |
| Sample 3 | 0.99 | 12.95 |
| Sample 4 | 2.48 | 14.61 |
| Sample 5 | 1.46 | 14.11 |

When the entire surface of the subcarrier 420 is a smooth surface, the laser beam is reflected on the smooth surface of the subcarrier 420 during the irradiation of the laser on the subcarrier 420 to be described later. Accordingly, the heating efficiency is not good and the bonding strength between the subcarrier 420 and the substrate 40 through the metal layers 71, 73, and 72 is not sufficient in some cases. However, when the third and fourth side surfaces 424 and 425 of the subcarrier 420 are roughened, the heat capacity is suppressed, the reflection of the laser beam irradiating the third and fourth side surfaces 424 and 425 of the subcarrier 420 is suppressed, and the heating efficiency of the subcarrier 420 can be improved. Accordingly, it is possible to improve the metal bonding strength.

The upper surface 421 and the first side surface 422 of the subcarrier 420 are formed as smooth surfaces. Since the upper surface 421 of the subcarrier 420 is formed as a smooth surface, it is possible to form the metal layer having a uniform thickness on the upper surface 421 and to reliably and strongly mount the LD 30 onto the subcarrier 420 through the metal layer. Further, since the first side surface 422 of the subcarrier 420 is formed as a smooth surface, it is possible to form the metal layer 71 having a uniform thickness on the first side surface 422 and to reliably and strongly connect the subcarrier 420 to the side surface of the substrate 40 through the metal layers 71, 73, and 72.

It is preferable that the second side surface 423 and the bottom surface 26 of the subcarrier 420 also be smooth surfaces. Accordingly, the second side surface 423 and the bottom surface 26 of the subcarrier 420 can be held by vacuum suction. Thus, the position of the subcarrier 420 can be adjusted while irradiating the third and fourth side surfaces 424 and 425 of the subcarrier 420 with a laser beam.

The roughening method for forming the roughened region is not particularly limited and a known method for roughening the surface of the inorganic member can be used by either a wet method or a dry method. For example, the roughened region can be formed at any place by a method such as sandblasting. Instead of sandblasting, sandpaper or the like may be used to form scratches on the side surfaces of the subcarrier.

Further, the roughened region may be formed by a method adopting a processing condition in which a cut surface becomes rough when a collective substrate of the subcarrier 420 is diced and individualized. Specifically, roughening can be performed by adjusting the size of the diamond abrasive grains adhered to the blade of the diamond cutter. In addition, the roughened region can be formed under predetermined conditions by using a cutting method using a laser.

The emission surface 31 of the LD 30 and the incident surface 61 of the PLC 50 are arranged with a predetermined distance therebetween (see FIG. 15(b)). The incident surface 61 faces the emission surface 31 and the gap 70 is formed between the emission surface 31 and the incident surface 61 in the y direction. When the integrated optical device 10A is exposed to air, the gap 70 is full of air. Considering the amount of light required when the integrated optical device 10A is used for a head-mounted display or the like, the size of the gap (distance) 70 in the y direction is, for example, larger than 0 μm and 5 μm or less.

Figure 16:
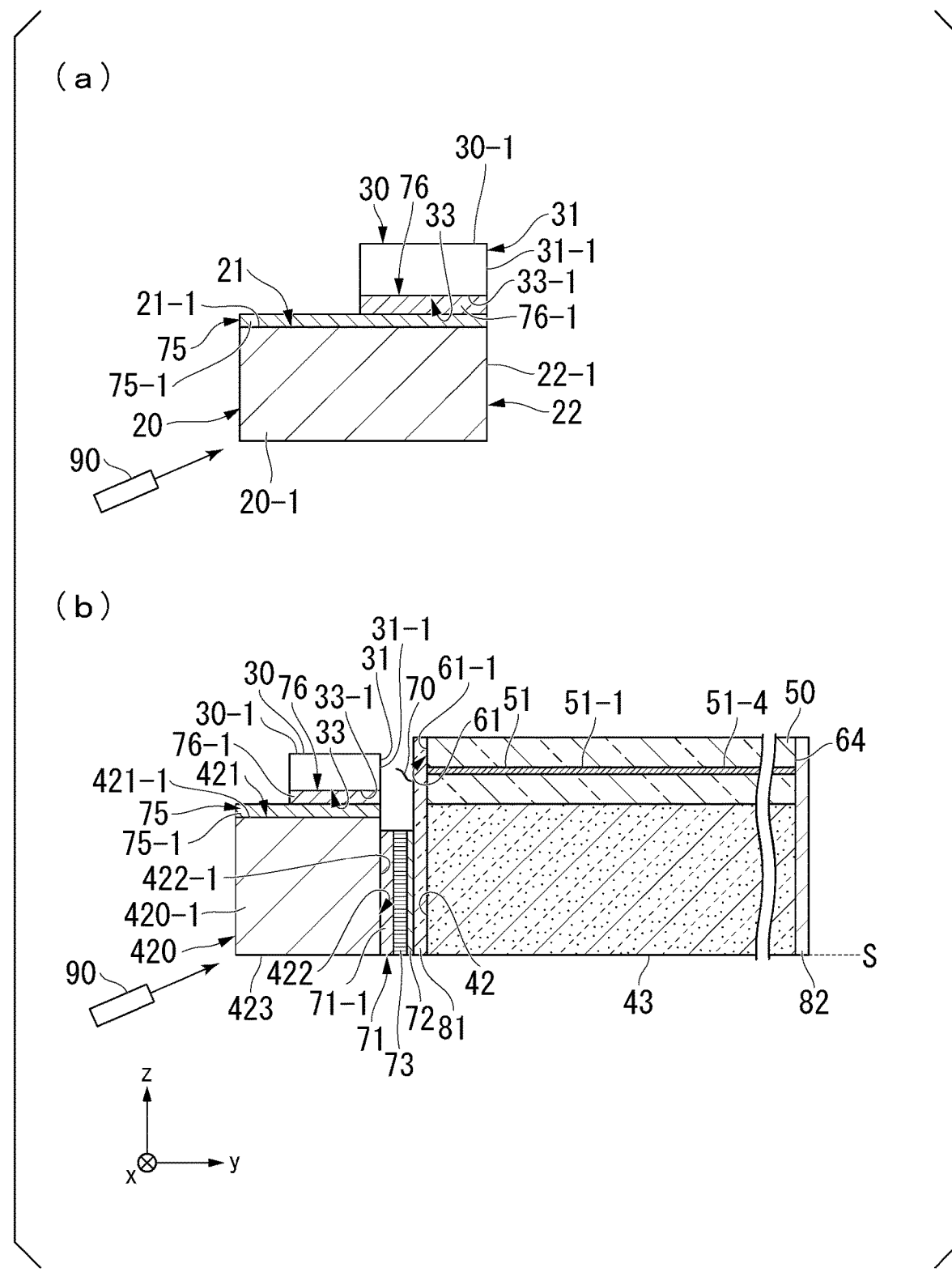
FIG. 16 is a cross-sectional view illustrating an example of a method for manufacturing the integrated optical device of the second embodiment.

Next, a method for manufacturing the integrated optical device 10A will be simply described. FIG. 16 is a diagram illustrating a method for manufacturing the integrated optical device 10A. First, the LD 30 of the bare chip is mounted on the upper surface 421 of the subcarrier 420 by a known method. For example, the metal layer 75 is formed on the upper surface 421 of the subcarrier 420 by sputtering, vapor deposition, or the like. Further, the first metal layer 76 is formed on the lower surface 33 of the LD 30 (for example, the lower surface 33-1 of the LD 30-1) by sputtering, vapor deposition, or the like. Next, as shown in FIG. 16(a), for example, the subcarrier 420 is irradiated with a laser beam from the laser device 90 so that only the subcarrier 420 is heated to a degree that melting or deforming does not occur. Heat transfer from the subcarrier 420 softens or melts the metal layers 75 and 76 and then cools them. Accordingly, the LD 30 is bonded to the upper surface 421 of the subcarrier 420 through the metal layers 75 and 76. Further, the first metal layer 71 is formed on the first side surface 422 of the subcarrier 420 by sputtering, vapor deposition, or the like before or after the LD 30 is mounted on the subcarrier 420.

Next, the PLC 50 is formed on the upper surface 41 of the substrate 40 by a known semiconductor process. Next, the antireflection films 81 and 82 and the antireflection film (not shown) are formed on the incident surface 61 and the emission surface 64. Further, the second metal layer 72 and the third metal layer 73 are formed in this order behind the antireflection film 81 in the y direction by sputtering, vapor deposition, or the like.

Next, the emission surface 31 and the incident surface 61 in the LDs 30 and the cores 51-1, 51-2, and 51-3 corresponding to each other in the x direction and the z direction are allowed to face each other in the y direction with a distance therebetween. The optical axis of each color light emitted from the LD 30 and the center of the incident surface 61 of the corresponding core are substantially overlapped with each other. At this time, the bottom surface 423 of the subcarrier 420 and the bottom surface 43 of the substrate 40 are arranged so that the bottom surface 423 of the subcarrier 420 and the bottom surface 43 of the substrate 40 are substantially on the same plane.

Next, as shown in FIG. 16(b), the subcarrier 420 is irradiated with a laser beam from the laser device 90 to soften or melt the first metal layer 71, the second metal layer 72, and the third metal layer 73 due to the heat transfer from the subcarrier 420. The relative positions of the LD 30 and the PLC 50 are adjusted and the subcarrier 420 having the LD 30 mounted thereon is bonded to the substrate 40 provided with the PLC 50 so that the bottom surface 423 of the subcarrier 420 and the bottom surface 43 of the substrate 40 are substantially on the same plane. By these steps, it is possible to manufacture the integrated optical device 10A in which the bottom surface 423 of the subcarrier 420 and the bottom surface 43 of the substrate 40 are located on the substantially same plane.

Figure 17:
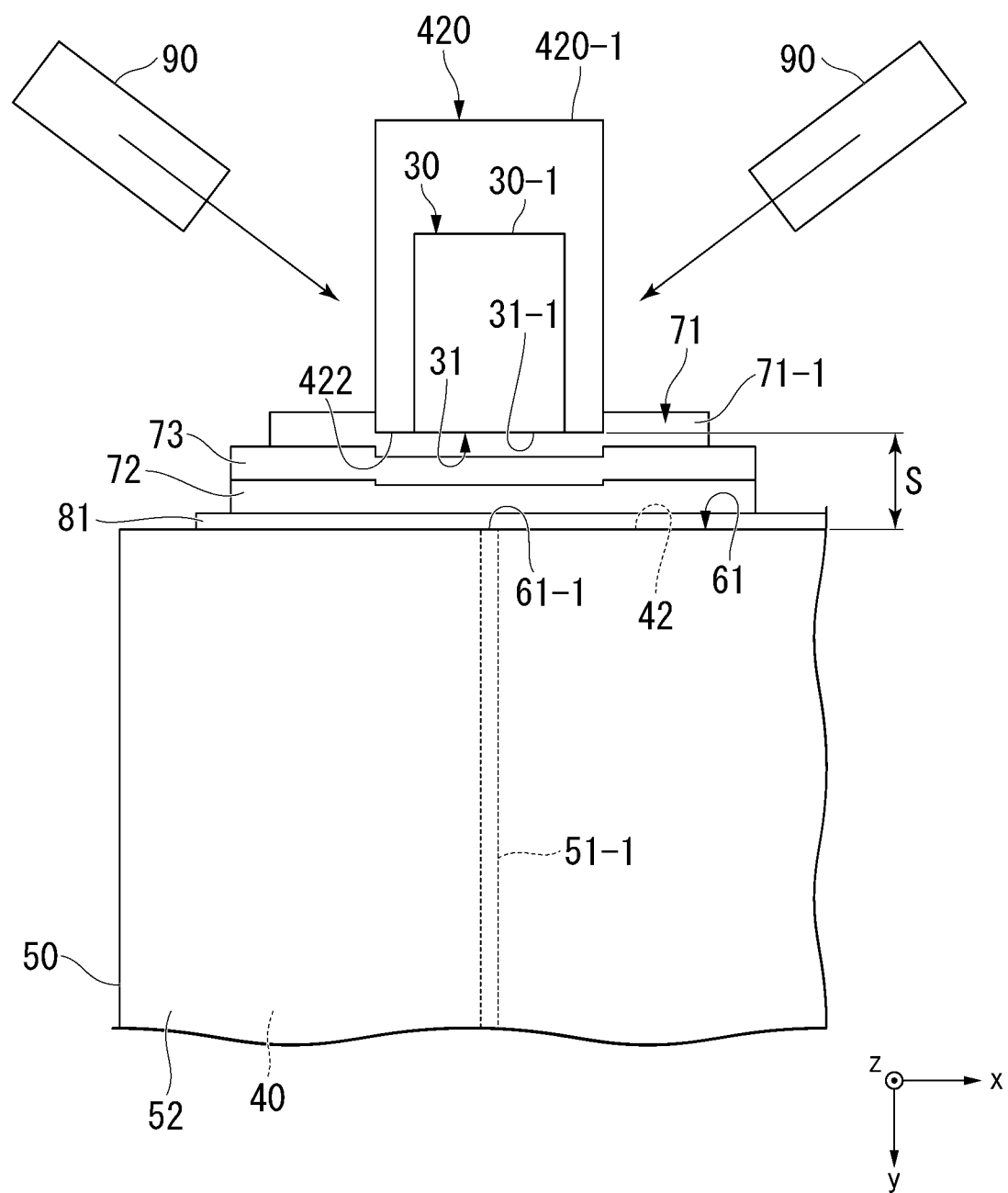
FIG. 17 is a plan view illustrating a method for manufacturing the integrated optical device of the second embodiment.
Figure 18:
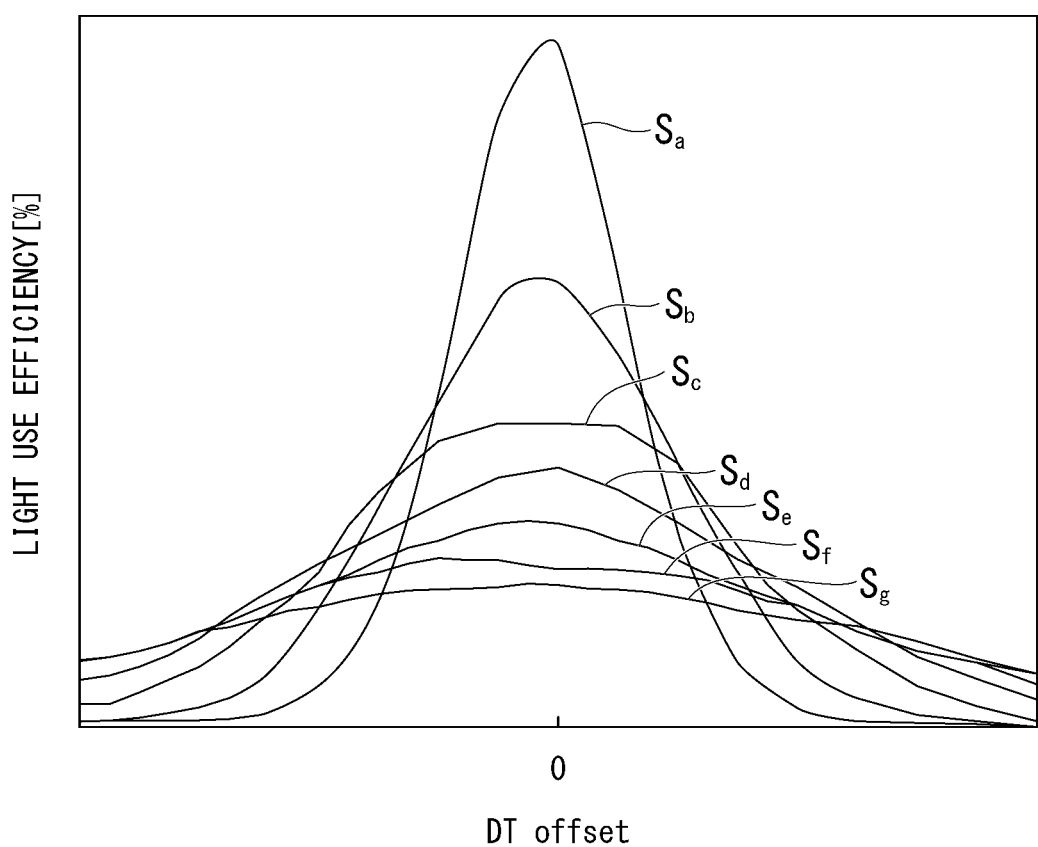
FIG. 18 is a graph showing a relationship between light utilization efficiency and a distance between the incident surface of the PLC and an emission surface of an LD of the integrated optical device of the second embodiment.

Specifically, as shown in FIG. 17, the laser device 90 is disposed on both sides of the subcarrier 420 in the X direction, a laser beam emitted from the laser device 90 is applied to the third side surface 424 and the fourth side surface 425 of the subcarrier 420 in a direction indicated by an arrow so that only the subcarrier 420 is heated to a degree that melting or deforming does not occur. At the same time, each color light is emitted from the LD 30, the emission intensity is detected, and the emission intensity of the three color light emitted from the core 51-4 is detected. As shown in FIG. 18, when the distance S between the emission surface 31 and the incident surface 61 in the y direction is at a value on the order of microns and the emission intensity with respect to the light-emitting intensity is the light utilization efficiency [%], the light utilization efficiency decreases as the distance S increases (Sa<Sb<Sc<Sd<Se<Sf<Sg). The "light utilization efficiency" at each distance S means the light utilization efficiency when DT offset of the horizontal axis of the graph of FIG. 18 is 0 (zero). The optimum distance S changes according to the intended use of the integrated optical device 10A, the emission pattern of the LD 30, and the sizes of the cores 51-1, 51-2, and 51-3 in the x direction and the z direction. The positions and orientations of the distance S and the LD 30 are adjusted to satisfy the required light utilization efficiency in consideration of these conditions. Such adjustment of the position and orientation of the LD 30 means performing so-called active alignment and gap control. The adjustment of the distance S and the LD 30 can be performed using a known device having an active alignment function.

With the active alignment, the gap control, and the heating of the subcarrier 420, as shown in FIG. 17, the first metal layer 71, the second metal layer 72, and the third metal layer 73 disposed between the incident surface 61 and the emission surface 31 of the LD 30 disposed at an optimal position become thinner than each metal layer not interposed between the emission surface 31 and the incident surface 61 due to the alloying and slight heat shrinkage of the third metal layer 73. By stopping the heating of the subcarrier 420 due to the laser device 90, the position of the LD 30 is fixed by cooling. By proceeding with the above procedure, the integrated optical device 10A can be manufactured.

As described above, since the third side surface 424 and the fourth side surface 425 of the subcarrier 420 are roughened and the roughened region 420S is irradiated with the laser beam, it is possible to improve the heating efficiency by suppressing the reflection of the laser beam during the heating of the subcarrier 420. Thus, it is possible to improve the bonding strength when the subcarrier 420 and the substrate 40 are bonded to each other through the first metal layer 71, the second metal layer 72, and the third metal layer 73.

The integrated optical device 10A of this embodiment described above includes the subcarrier 420, the LD 30, the substrate 40, and the PLC 50. The incident surface 61 is disposed to face the emission surface 31 so that the light emitted from the LD 30 can be incident to the cores 51-1, 51-2, and 51-3. Further, the first side surface 422 of the subcarrier 420 and the side surface 42 of the substrate 40 are connected to each other from the rear to the front in the y direction via the first metal layer 71, the second metal layer 72, and the third metal layer 73.

Figure 19:
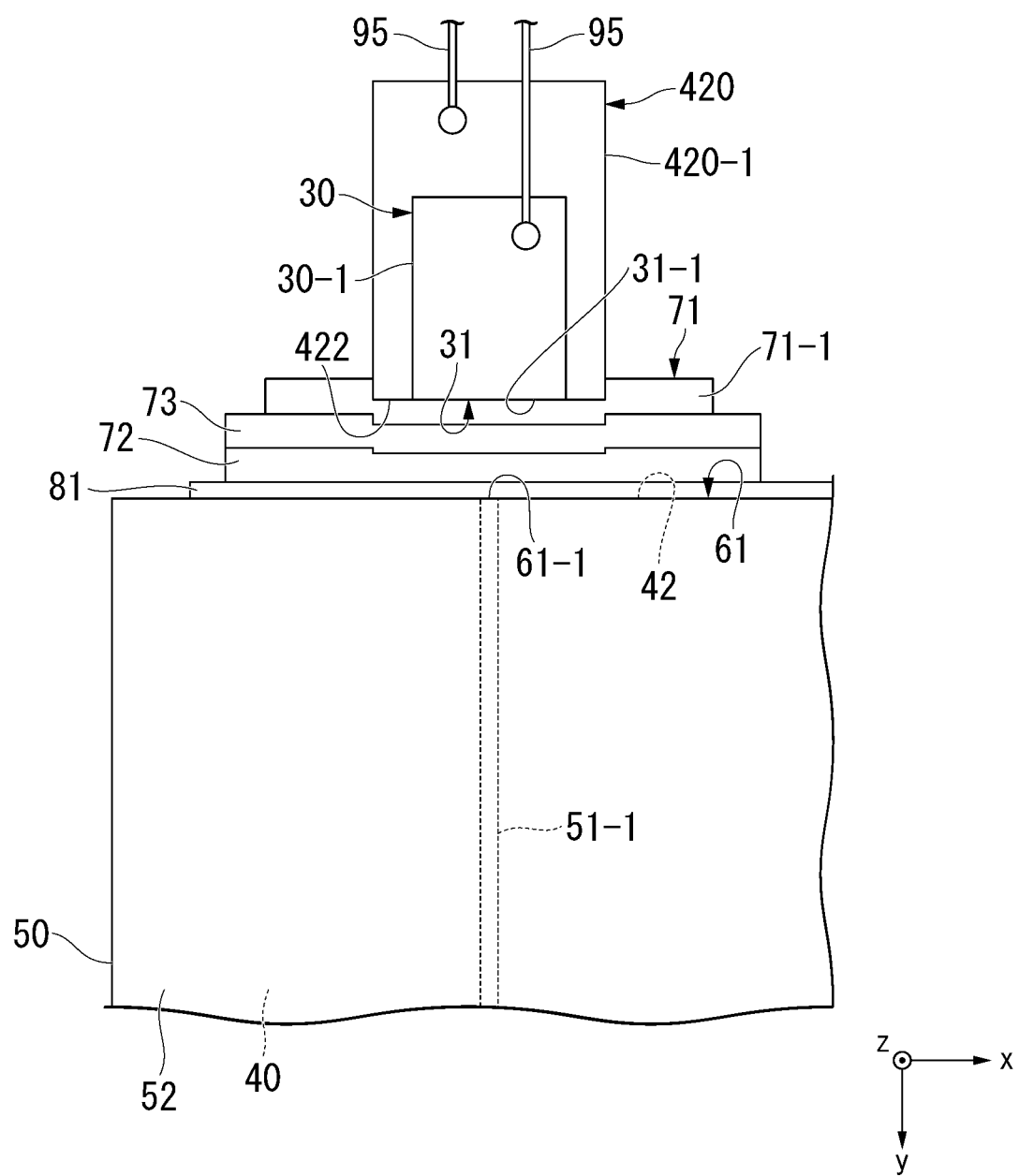
FIG. 19 is a plan view showing a state in which the LD of the integrated optical device of the second embodiment is wire-bonded.

According to the above-described configuration, the first metal layer 71 and the second metal layer 72 are strongly bonded to the first side surface 422 and the side surface 42 of the mounting base 40 and the third metal layer 73 is strongly bonded to the first metal layer 71 and the second metal layer 72 in the substantially entire area within the plane including the x direction and the z direction of the first side surface 422 while being alloyed at the interface with the first metal layer 71 and the second metal layer 72. The connection between the subcarrier 420 and the substrate 40 by the first metal layer 71, the second metal layer 72, and the third metal layer 73 due to such alloying is resistant to heat and is difficult to be released even when the ambient environment temperature rises in a process such as wire-bonding, for example, as shown in FIG. 19. Thus, the PLC 50 is kept in a strong fixed state to the LD 30 even when the LD 30 and a power supply (not shown) are connected by the wire 95 on the upper surface 421 using a method such as wire-bonding. That is, the LD 30 or the subcarrier 420 does not slip off from the PLC 50 or the substrate 40 and the LD 30 is held at an optimal position with respect to the PLC 50 during wire-bonding. Accordingly, it is possible to improve the reliability of the integrated optical device 10A by exhibiting desired light utilization efficiency and optical characteristics in the integrated optical device 10A.

On the other hand, in the conventional bonding of the LD and the PLC using a resin or the bonding of the subcarrier and the substrate, hydrogen bonds due to substituents occur in a resin having a high molecular as a molecular structure. Since the density of substituents in the resin is low, local bonding is achieved within the formation plane of the resin. In the application to the configuration of the integrated optical device 10A, the LD and PLC and the subcarrier and the substrate are locally bonded in the plane including the x direction and the z direction. Therefore, it is presumed that in the conventional connection using a resin, the connection strength is lower than that the full-scale and strong bonding by alloying.

Further, according to the integrated optical device 10A of this embodiment, since the third metal layer 73 is thicker than the first metal layer 71 and the second metal layer 72, the first metal layer 71 and the third metal layer 73 and/or the third metal layer 73 and the second metal layer 72 are sufficiently alloyed and hence the subcarrier 420 and the substrate 40 can be more strongly bonded to each other. Further, it is possible to ensure the distance between the substrate 40 and the alloy layer of the first metal layer 71 and the third metal layer 73 in the y direction.

Further, according to the integrated optical device 10A of this embodiment, the lower ends of the first metal layer 71, the second metal layer 72, and the third metal layer reach the same positions as the lower end of the subcarrier 420 and the lower end of the substrate 40 when viewed from the y direction (light traveling direction). That is, similarly to the integrated optical device 10A according to the first embodiment, the bonding area of the subcarrier 420 is maximized and the substrate 4 of the subcarrier 420 can be strongly bonded.

Further, according to the integrated optical device 10A of this embodiment, since the antireflection film 81 is provided between the LD 30 and the PLC 50, it is possible to prevent the reflection of each color light emitted from the LD 30 on the incident surface 61 and to improve the coupling efficiency of each color light to the cores 51-1, 51-2, and 51-3.

Further, in the integrated optical device 10A of this embodiment, since the emission surface 31 of the LD 30 and the incident surface 61 of the PLC 50 are arranged with a predetermined distance therebetween, the relative arrangement between the LD and the PLC is not influenced by the inclusions between the emission surface of the LD and the incident surface of the PLC as in the conventional integrated optical element in which a resin is interposed between the emission surface of the LD and the incident surface of the PLC. Accordingly, it is possible to prevent the occurrence of a deviation in the relative arrangement between the LD 30 and the PLC 50.

Further, the integrated optical device 10A of this embodiment includes the plurality of LDs 30 that emit light having different peak wavelengths (wavelengths). That is, the integrated optical device 10A includes the plurality of LDs 30-1, 30-2, and 30-3, the PLC 50 is provided with the plurality of cores 51-1, 51-2, and 51-3 into which the light emitted from the plurality of LDs 30-1, 30-2, and 30-3 can be incident, and the plurality of cores 51-1, 51-2, and 51-3 are gathered together on the front side reaching the emission surface 64. According to such a configuration, three-color light having different peak wavelengths (wavelengths) can be efficiently incident to the plurality of cores 51-1, 51-2, and 51-3 and the light utilization efficiency of the three-color light emitted from the emission surface 64 can be improved.

Further, in the integrated optical device 10A of this embodiment, the bottom surface 423 of the subcarrier 420 and the bottom surface 43 of the substrate 40 are formed in the state on the substantially same plane S. That is, even in the integrated optical device 10A of this embodiment, similarly to the integrated optical device 10 of the first embodiment, the heat generated by the operation of the optical semiconductor device (LD) 30 can be efficiently dissipated to both the first side surface 422 and the bottom surface 423 of the subcarrier 420.

FIGS. 20(a) to 20(f) and FIGS. 21(a) to 21(f) are development views showing modified examples of the configuration of the subcarrier 420.

Figure 20:
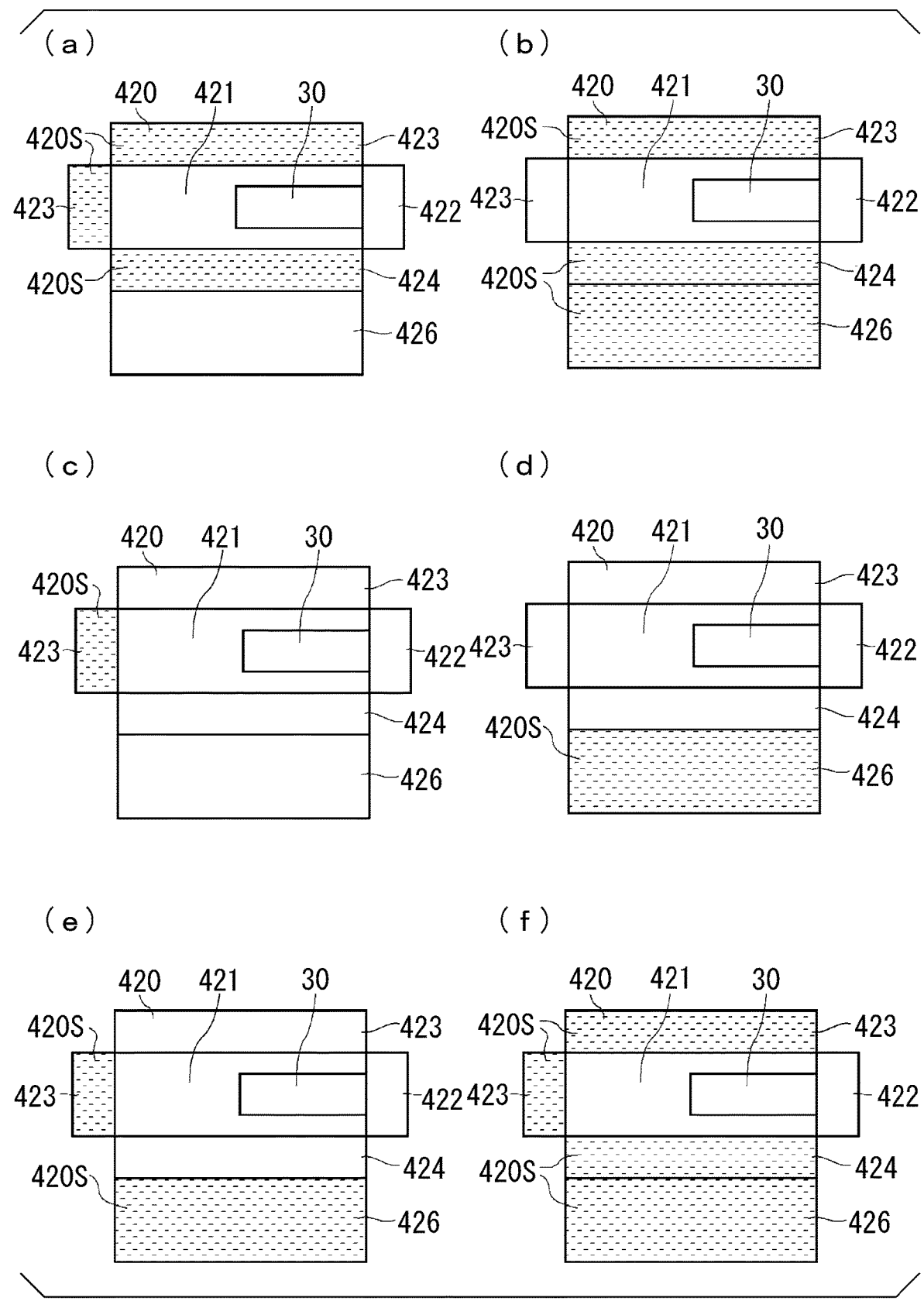
FIG. 20 is a development view showing a modified example of a configuration of the subcarrier.

In the subcarrier 420 shown in FIG. 20(a), the upper surface 421, the first side surface 422, and the bottom surface 426 are formed as smooth surfaces and the entire surfaces of the second side surface 423, the third side surface 424, and the fourth side surface 425 are formed as the roughened region 420S. That is, the roughened region 420S is further added to the second side surface 423 of the subcarrier 420 shown in FIG. 15.

In the subcarrier 420 shown in FIG. 20(b), the upper surface 421, the first side surface 422, and the second side surface 423 are formed as smooth surfaces and the entire surfaces of the third side surface 424, the fourth side surface 425, and the bottom surface 426 are formed as the roughened region 420S. That is, the roughened region 420S is further added to the bottom surface 426 of the subcarrier 420 shown in FIG. 15.

In the subcarrier 420 shown in FIG. 20(c), only the second side surface 423 is formed as the roughened region 420S and all other outer surfaces are formed as smooth surfaces. In FIG. 20(d), only the bottom surface 426 is formed as the roughened region 420S and all other outer surfaces are formed as smooth surfaces.

In FIG. 20(e), only the second side surface 423 and the bottom surface 426 are formed as the roughened region 420S and all other outer surfaces are formed as smooth surfaces. Thus, the third side surface 424 and the fourth side surface 425 are smooth surfaces.

In FIG. 20(f), the upper surface 421 and the first side surface 422 are formed as smooth surfaces and all surfaces other than the upper surface 421 and the first side surface 422 are formed as the roughened region 420S.

Figure 21:
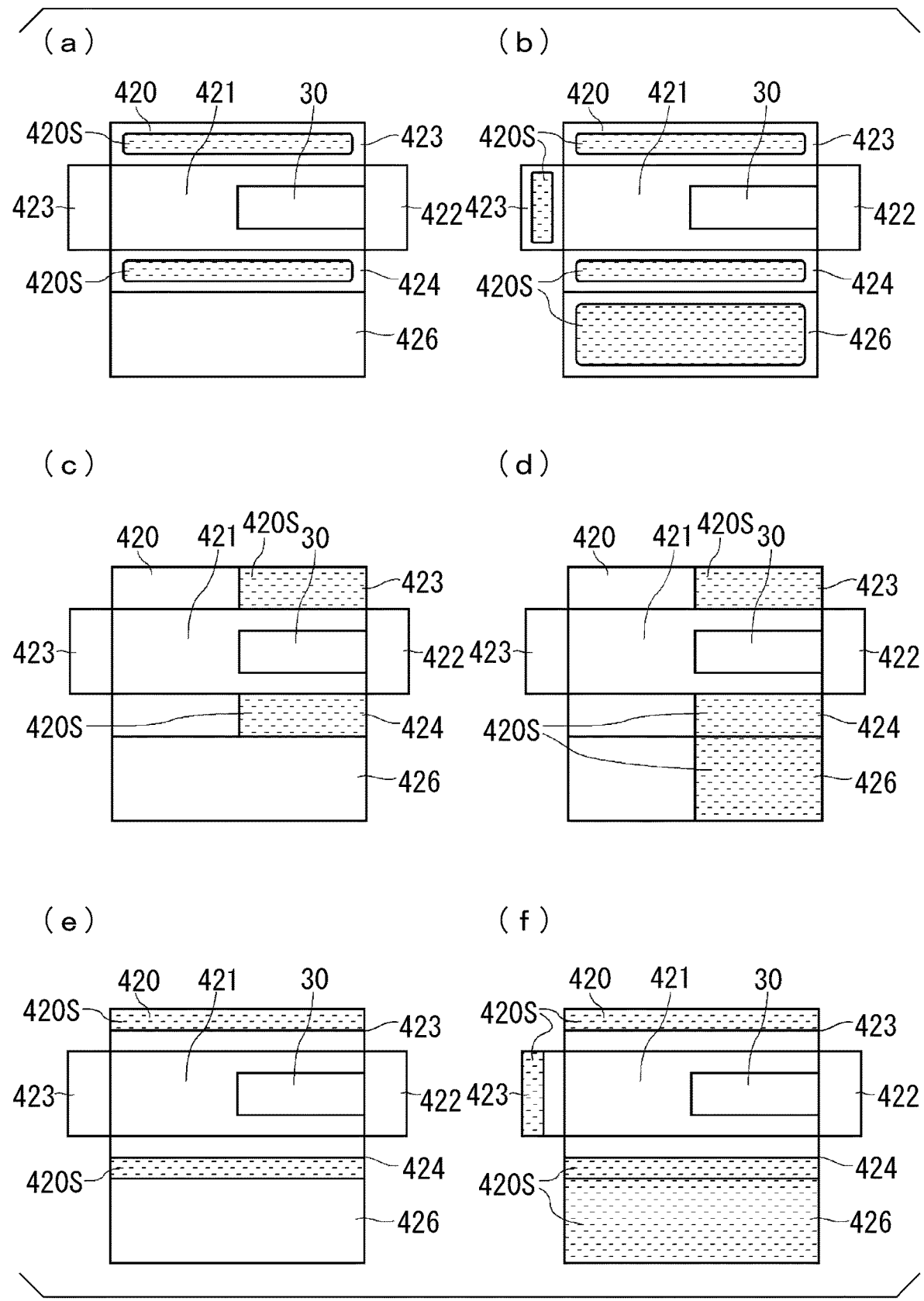
FIG. 21 is a development view showing a modified example of a configuration of the subcarrier.

In the subcarrier 420 shown in FIG. 21(a), the roughened region 420S is provided only on the center portion of each surface instead of the entire surfaces of the third side surface 424 and the fourth side surface 425. Therefore, a smooth surface is formed in the vicinity of the edges of the third side surface 424 and the fourth side surface 425.

In the subcarrier 420 shown in FIG. 21(b), the same roughened region 420S as the third side surface 424 and the fourth side surface 425 is also provided on the second side surface 423 and the bottom surface 426. In this way, the roughened region 420S does not have to be formed on the entire surface of the target surface, but may be formed only on a part of the target surface, that is, the laser irradiation region.

In the subcarrier 420 shown in FIG. 21(c), the front half region near the first side surface 422 is formed as the roughened region 420S and the rear half region near the second side surface 423 is formed as a smooth surface in the third side surface 424 and the fourth side surface 425. Further, in the subcarrier 420 shown in FIG. 21(d), the same roughened region 420S is also formed on the front half region of the bottom surface 426. In this way, the roughened region 420S may be provided only in the front region near the first side surface 422 in relation to the middle position between the first side surface 422 and the second side surface 423.

In the subcarrier 420 shown in FIG. 21(e), the lower half region near the bottom surface 426 is formed as a roughened region and the upper half region near the upper surface 421 is formed as a smooth surface in the third side surface 424 and the fourth side surface 425. The subcarrier 420 shown in FIG. 21(f) forms the same roughened region 420S also in the lower half region of the second side surface 423 and the entire surface of the bottom surface 426. In this way, the roughened region 420S may be provided only in the lower region near the bottom surface 426 in relation to the middle position between the upper surface 421 and the bottom surface 426.

As described above, the subcarrier 420 has a substantially rectangular parallelepiped shape and includes the upper surface 421, the first to fourth side surfaces 422 to 425, and the bottom surface 426. Here, when the upper surface 421 on which the LD 30 is mounted is a first outer surface, the first side surface 422 which is connected to the substrate 40 is a second outer surface, and the remaining surface is a third outer surface, the roughened region 420S may be provided in at least a part of the third outer surface. That is, in the present invention, the roughened region 420S may be formed on at least a part of any one of the second side surface 423, the third side surface 424, the fourth side surface 425, and the bottom surface 426.

Third Embodiment

Figure 22:
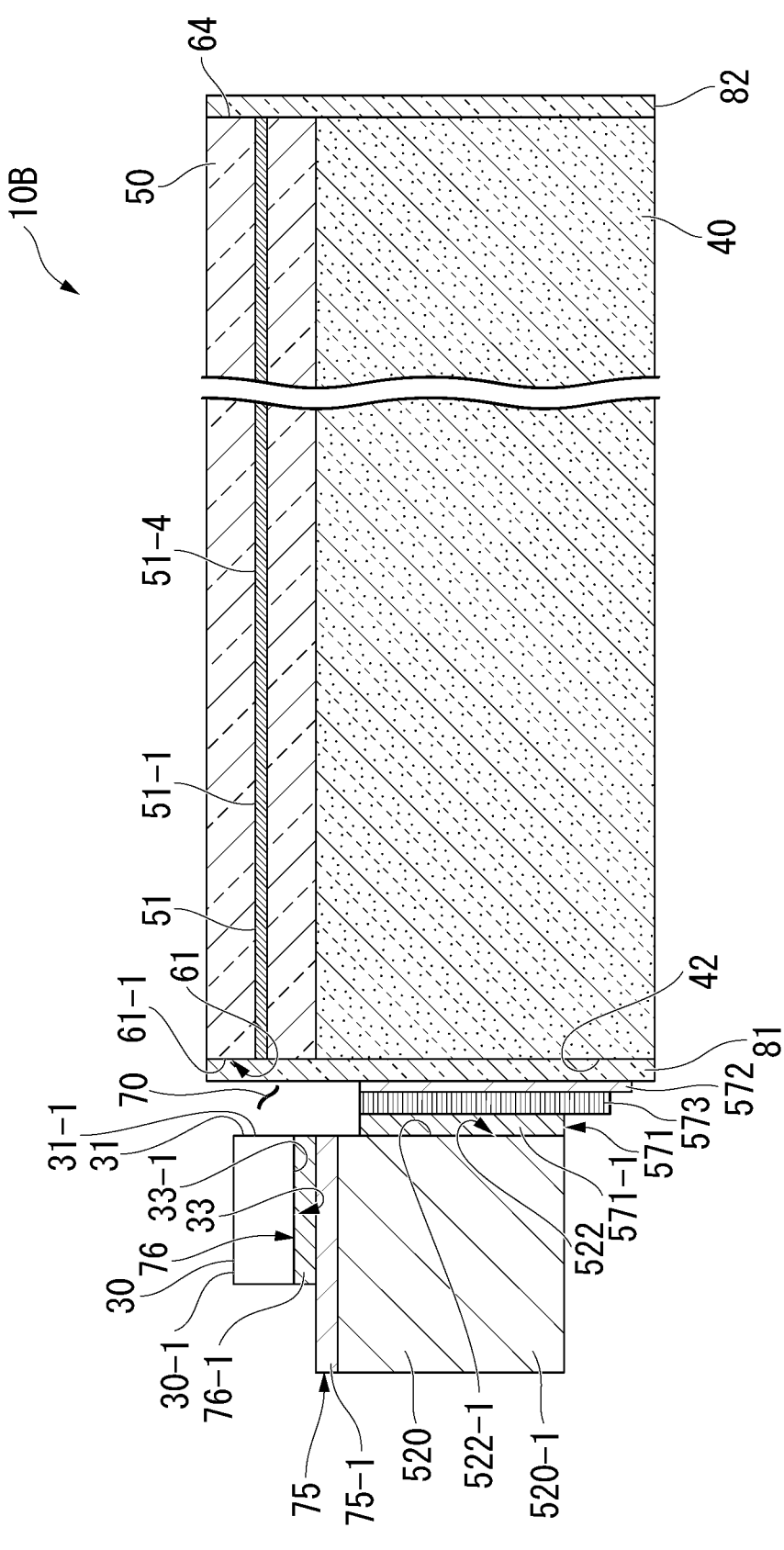
FIG. 22 is a cross-sectional view of an integrated optical device of a third embodiment.

FIG. 22 is a cross-sectional view of an integrated optical device 10B according to a third embodiment. In the integrated optical device 10B according to the third embodiment, the lengths of a subcarrier 520, a first metal layer 571, a second metal layer 572, and a third metal layer 573 in the z direction are different from those of the integrated optical device 10A of the second embodiment. In the integrated optical device 10B, the same configuration as the integrated optical device 10A is designated by the same reference numerals, and the description thereof will be omitted.

In this embodiment, the first metal layer 571 is provided on the side surface facing the substrate 40 or the PLC 50 in the substantially entire area of the first side surface 522 while not being in contact with the metal layer 575. The front ends, that is, the upper ends of the second metal layer 572 and the third metal layer 573 in the z direction reach the same position as the first metal layer 571 on the front side in the z direction. The rear ends, that is, the lower ends of the second metal layer 572 and the third metal layer 573 in the z direction reach the position on the rear side of the first metal layer 571 and the front side of the antireflection film 81. When viewed from the y direction, the first metal layer 571 is formed to be larger than the subcarrier 520 in the x direction.

It is preferable that the area of the first metal layer 571, that is, the size thereof in the plane including the x direction and the z direction be substantially the same as the area of the second metal layer 572 and the third metal layer 573 or smaller than the area of the second metal layer 572 and the third metal layer 573.

The integrated optical device 10B according to this embodiment is manufactured by the same method as that of the integrated optical device 10A. In addition, in manufacturing the integrated optical device 10B, a bottom surface 523 of the subcarrier 520 and the bottom surface 43 of the substrate 40 may be offset from each other so that the bottom surface 523 of the subcarrier 520 and the bottom surface 43 of the substrate 40 are on the substantially same plane. Further, when bonding the subcarrier 520 having the LD 30 mounted thereon to the substrate 40 provided with the PLC, the bottom surface 523 of the subcarrier 520 and the bottom surface 43 of the substrate 40 do not have to be on the same plane.

Even in the integrated optical device 10B according to this embodiment, similarly to the integrated optical device 10A, the LD 30 or the subcarrier 520 does not slip off from the PLC 50 or the substrate 40 and the LD 30 is held at an optimal position with respect to the PLC 50, for example, during wire-bonding. Accordingly, it is possible to improve the reliability of the integrated optical device 10B by exhibiting desired light utilization efficiency and optical characteristics in the integrated optical device 10B.

Further, even in the integrated optical device 10B of this embodiment, the first metal layer 571 and the third metal layer 573 and/or the third metal layer 573 and the second metal layer 572 are sufficiently alloyed and the subcarrier 520 and the substrate 40 can be more strongly bonded to each other. Further, it is possible to ensure the distance between the substrate 40 and the alloy layer between the first metal layer 571 and the third metal layer 573 in the y direction.

Further, according to the integrated optical device 10B of this embodiment, since the area of the first metal layer 571 is smaller than the area of the second metal layer 572 when viewed from the y direction (light traveling direction), the bonding area between the subcarrier 520 and the substrate 40 can be ensured to be equal to or larger than at least the area of the first metal layer 571. Since the first metal layer 571 is provided in the substantially entire area of the first side surface 52B, the subcarrier 520 and the substrate 40 can be more strongly bonded to each other by maximizing the bonding area of the subcarrier 520.

(Integrated Optical Module)

Figure 23:
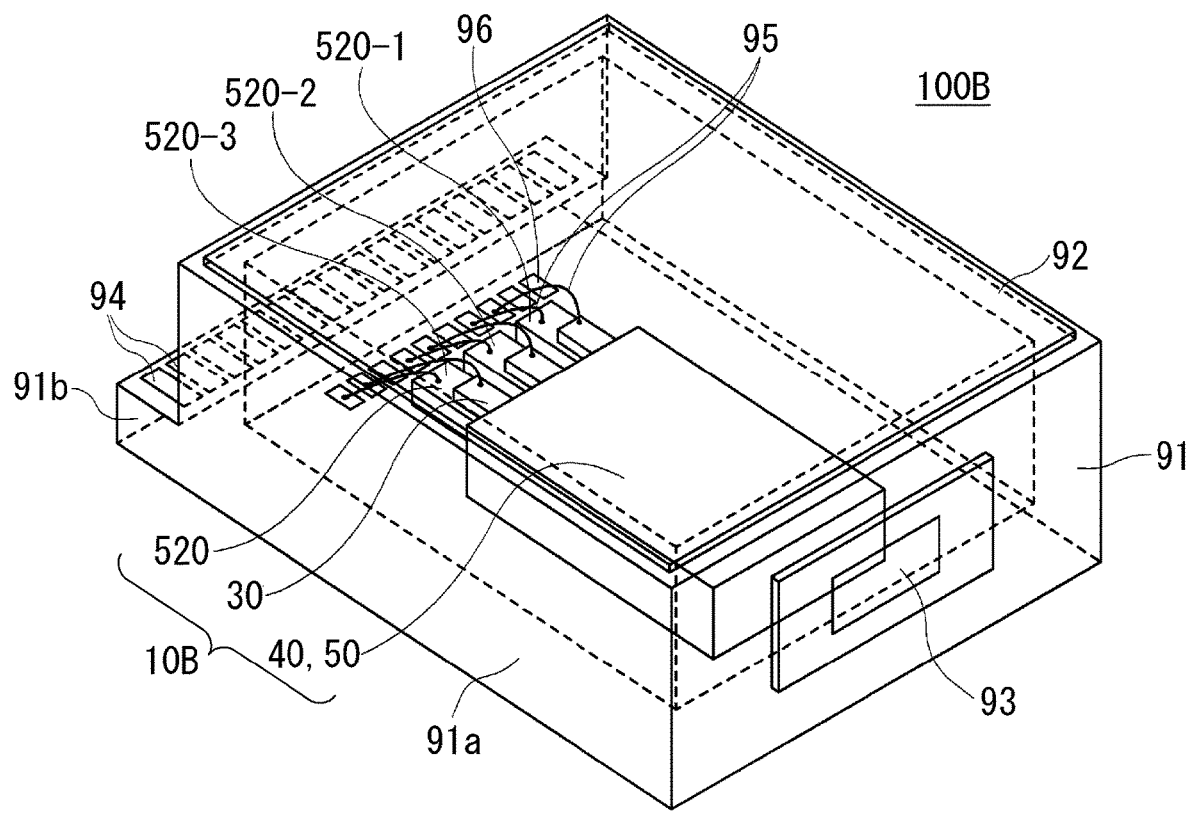
FIG. 23 is a schematic perspective view transparently showing an example of a structure of an integrated optical module obtained by packaging the integrated optical device of the third embodiment.

FIG. 23 is a schematic perspective view transparently showing an example of a structure of the integrated optical module 100B. As shown in FIG. 23, the integrated optical module 100B includes the integrated optical device 10B having a combination of the LD 30 on the subcarrier 20 and the PLC 50 of the substrate 40 and a package 91 accommodating the integrated optical device 10B. Then, the integrated optical device 10B is accommodated in the package 91 together with other components (not shown) such as a photo detector (PD) module and a controller IC chip, and is hermetically sealed together with an inert gas.

The package 91 includes a main body 91a which has an opening formed on the upper surface side and is made of resin or ceramic and a cover 92 which covers the opening formed on the upper surface of the main body 91a without a gap. A laser beam emission window 93 is provided at one end side surface of the main body 91a in the longitudinal direction. A portion corresponding to the emission window 93 in the main body 91a is provided with an opening. A laser beam emitted from the PLC 50 passes through the emission window 93 and is output to the outside. Further, a terminal block 91b integrated with the main body 91a is formed on the side surface side opposite to the side surface provided with the emission window 93 and a plurality of external electrode pads 94 are formed on the upper surface of the terminal block 91b. The plurality of external electrode pads 94 are electrically connected to any one of the plurality of internal terminal electrodes 96 in the package 91 and the LD 30 is connected to the internal terminal electrode 96 via a bonding wire (wire) 95.

The plurality of external electrode pads 94 are electrically connected to any one of the plurality of internal terminal electrodes 96 in the package 91 and the LD 30 is connected to the internal terminal electrode 96 via the wire 95. In this way, wire-bonding is used in the connection between the pad of the LD 30 and the internal terminal electrode 96, but when the bonding strength of the subcarrier 20 to the substrate 40 is weak, the subcarrier 20 may be peeled off from the substrate 40 due to the pressure applied during wire-bonding. However, in this embodiment, since the subcarrier 20 is strongly bonded to the substrate 40, the electrical connection between the casing-side terminal and the optical semiconductor device 30 by wire-bonding can be reliably performed.

In addition, the package 91 may be filled with an inert gas such as nitrogen ($N_2$).

Although the embodiments of the present invention have been described above, these embodiments are presented as examples and are not intended to limit the scope of the invention. This embodiment can be implemented in various other forms, and various omissions, replacements, and changes can be made without departing from the gist of the present invention. For example, the characteristic configurations of the above-described embodiments and modified examples may be combined.

For example, in the integrated optical device 10 (10A, 10B) of this embodiment, three optical semiconductor devices (LD) 30-1, 30-2, and 30-3 are provided on the upper surface (surface) 21 (421,521) of the subcarrier (mounting base) 20 (420, 520), but only at least one optical semiconductor device (LD) (for example, LD emitting white light) may be provided or four or more LDs may be provided. Further, the light emitted from the optical semiconductor devices (LDs) 30-1, 30-2, and 30-3 is not limited to the red light, the blue light, and the green light, and an LD emitting light having an arbitrary wavelength can be used.

Further, for example, one common heat sink and the like bonded to the bottom surface 23 of the subcarrier 20 and the bottom surface 43 of the substrate 40 located on the substantially same plane may be provided.

Further, in the integrated optical module 100 (100A), the heat sink and the like can be further bonded to the bottom surface of the package. Accordingly, the heat propagated from the integrated optical device 10 (10A, 10B) to the package 110 can be further efficiently dissipated to the outside.

Further, for example, in the integrated optical device 10 (10A, 10B), the subcarrier 20 (420, 520) and the substrate 40 may be connected to each other through a metal composite layer (not shown) including at least the alloy layer of the metal of the first metal layer 71 (571) and the third metal layer 73 (573) and/or the alloy layer of the metal of the second metal layer 72 (572) and the third metal layer 73 (573). The "metal composite layer including at least the alloy layer of the metal of the first metal layer 71 (571) and the third metal layer 73 (573) and/or the alloy layer of the metal of the second metal layer 72 (572) and the third metal layer 73 (573)" means a layer partially including the alloy layer of the metal of the first metal layer 71 (571) and the third metal layer 73 (573) and/or the alloy layer of the second metal layer 72 (572) and the third metal layer 73 (573) or a layer entirely including the alloy layer of the metal of the first metal layer 71 (571) and the third metal layer 73 (573) and the alloy layer of the metal of the second metal layer 72 (572) and the third metal layer 73 (573). As an example, in the integrated optical device 10 (10A, 10B), there is a case in which the metal of the first metal layer 71 (571) and the metal of the third metal layer 73 (573) are alloyed partially or entirely in the y direction to form one alloy layer.

Further, for example, there is a case in which the metal of the second metal layer 72 (572) and the metal of the third metal layer 73 (573) are alloyed partially or entirely in the y direction to form one alloy layer. In these cases, the subcarrier 20 (420, 520) and the substrate 40 can be connected to each other through any one of or both the alloy layer of the first metal layer 71 (571) and the third metal layer 73 (573) and the alloy layer of the second metal layer 72 (572) and the third metal layer 73 (573). According to such a configuration, the subcarrier 20 (420, 520) and the substrate 40 can be strongly connected as compared with the conventional resin connection using the alloy layer and the reliability of the integrated optical device can be improved.

Further, for example, in the integrated optical device 10 (10A, 10B), the subcarrier 20 (420, 520) and the LD 30 may be connected to each other through the metal composite layer including at least the alloy layer of the metal layers 75 and 76. The "metal composite layer including at least the alloy layer of the metal layers 75 and 76" means a layer partially including the alloy layer of the metal layer 75 and the metal layer 76 or a layer entirely including the alloy layer. As an example, there is a case in which the metal of the metal layer 75 and the metal of the metal layer 76 are partially or entirely alloyed in the z direction to form an alloy layer in the integrated optical device 10 (10A, 10B). When the metal of the metal layer 75 and the metal of the metal layer 76 are partially alloyed in the z direction, the alloy layer of the metal layers 75 and 76 and any one of or both the metal layer 75 and the metal layer 76 are interposed between the subcarrier 20 (420, 520) and the LD 30. When the metal of the metal layer 75 and the metal of the metal layer 76 are entirely alloyed in the z direction, only the alloy layer is substantially interposed between the subcarrier 20 (420, 520) and the LD. Further, although it is preferable that the metal layer 75 and the metal layer 76 be entirely alloyed in the y direction to form the alloy layer, the present invention is not limited to such a configuration. For example, these metal layers may be partially alloyed in the y direction to form the alloy layer.

In order to connect the subcarrier 20 (420, 520) and the substrate 40 to each other, the metal material interposed between the subcarrier 20 (420, 520) and the substrate 40 can be appropriately changed in accordance with each material of the subcarrier 20 (420, 520), the substrate 40, and the first metal layer 71 (571). Further, the thickness of the metal material of the metal layer or the alloy layer is also appropriately set in accordance with each material of the subcarrier 20 (420, 520), the substrate 40, and the first metal layer 71 (571). In accordance with the type and thickness of the metal material, the heating condition of the subcarrier 20 (420, 520), and the like, the configuration of the metal composite layer interposed between the subcarrier 20 (420, 520) and the substrate 40 can be changed. The metal composite layer may be a single alloy layer, a combination of a metal layer and an alloy layer, a combination of alloy layers having different compositions, or a multilayer structure including at least an alloy layer.

Although the integrated optical device 10 (10A, 10B) has been described as a combiner that combines light of the three primary colors in the visible wavelength range, the integrated optical device of the present invention is not limited to the combiner and can be widely used in optical communication applications.

Further, it has been described that the integrated optical device 10 (10A, 10B) can combine three primary colors in the visible wavelength range to be used in applications such as wearable devices and compact projectors, but the wavelength of light processed by the integrated optical device of the present invention is not limited to the visible wavelength range. For example, the wavelength range of light processed by the integrated optical device of the present invention may range from the visible wavelength range to the near infrared wavelength range or may be only in the near infrared wavelength range to be used in optical communication. The materials of the substrate 40, the PLC 50, various metal layers, and alloy layers may be selected according to the wavelength of light processed by the integration of the present invention.

EXAMPLES

The effect of the present invention was verified.

EXAMPLE

The integrated optical device 10 of the first embodiment shown in FIG. 1 was prepared and the heat dissipation state when bonding a package to the bottom surface 23 of the subcarrier 20 and the bottom surface 43 of the substrate 40 of the integrated optical device 10 through a thermally conductive adhesive was simulated.
Subcarrier: Silicon (Si)
Substrate: Silicon (Si)
Package: Aluminum oxide ($Al_2O_3$)
Adhesive: Epoxy resin

COMPARATIVE EXAMPLE

An integrated optical device having the same configuration as that of the example except that a bottom surface of a subcarrier was recessed in a thickness direction rather than a bottom surface of a substrate was prepared and a heat dissipation state when bonding a package to the bottom surface of the substrate of the integrated optical device through a thermally conductive adhesive was measured. The bottom surface of the subcarrier was not bonded to the package and a gap between the bottom surface of the subcarrier and an inner surface of the package was 0.5 mm.

Figure 24:
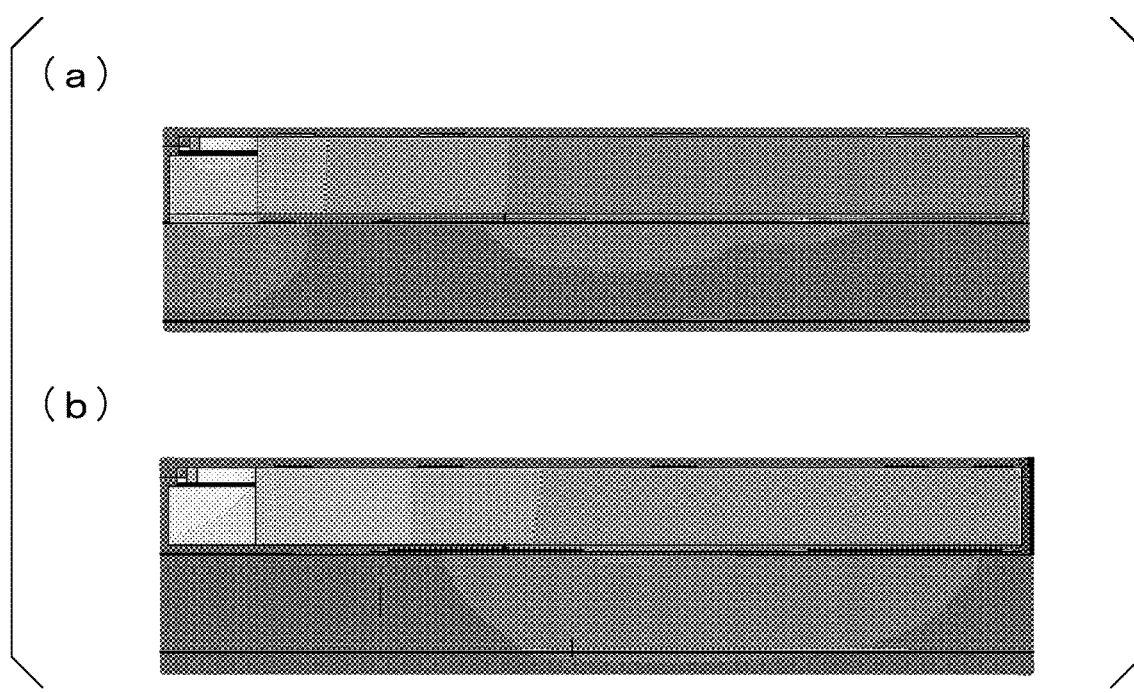
FIG. 24 is a heat distribution diagram showing a verification example of the present invention.

FIG. 24(a) shows a heat distribution when the LD 30 of the integrated optical device 10 of the example was heated by 1 W and FIG. 24(b) shows a heat distribution when the LD of the integrated optical device of the comparative example was heated by 1 W. Additionally, FIG. 24 shows a cross-section of a main part of the integrated optical module in the thickness direction.

According to the result shown in FIG. 24, since the bottom surface 23 of the subcarrier 20 and the bottom surface 43 of the substrate 40 of the integrated optical device 10 of the example were bonded to the package to be on the substantially same plane S, it was confirmed that the heat generated from the LD 30 was dissipated to the package from each of the bottom surface 23 of the subcarrier 20 and the bottom surface 43 of the substrate 40. Accordingly, it was confirmed that the temperature of the LD 30 was kept lower than that of the comparative example.

On the other hand, in the integrated optical device of the comparative example, since the bottom surface of the subcarrier had a step with respect to the bottom surface of the substrate and only the bottom surface of the substrate was bonded to the package, the heat generated from the LD was dissipated to the package only on the bottom surface of the substrate located at a position separated from the LD. Therefore, the heat dissipation efficiency was poor as compared with the example and the temperature of the LD was higher than that of the example.

Next, a relationship between the maximum temperature change value and the thermal conductivity of the adhesive for bonding the integrated optical device to the package in the example and comparative example was measured. This result is shown by the graph in FIG. 25.

Figure 25:
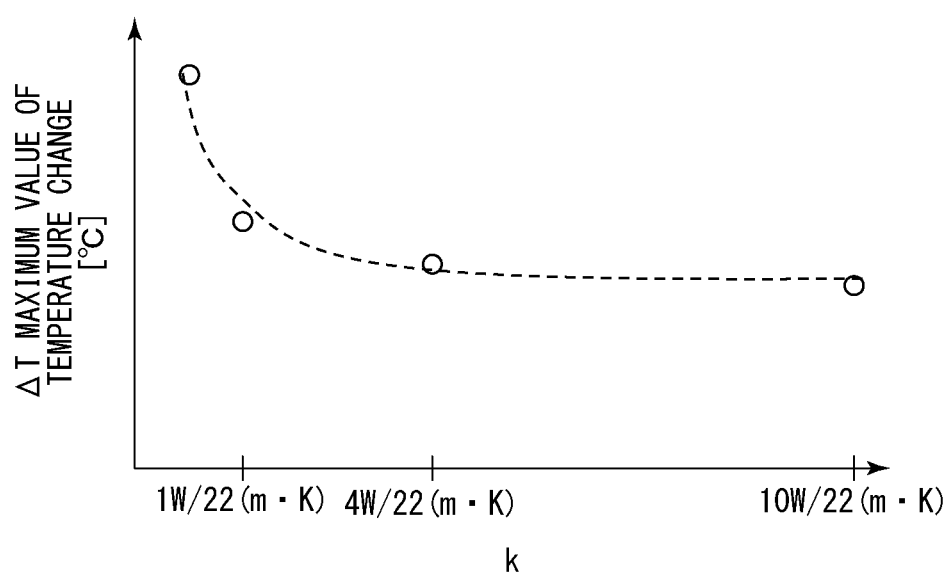
FIG. 25 is a graph showing a verification example of the present invention.

According to the measurement result of FIG. 25, it was confirmed that the temperature change amount of the integrated optical module can be minimized by setting the thermal conductivity to 1 W/(m·K) or more and the temperature change amount of the integrated optical module can be suppressed by setting the thermal conductivity to 4 W/(m·K) or more.

REFERENCE SIGNS LIST

10 Integrated optical device
20, 420, 520 Subcarrier (mounting base)
20-1, 420-1, 520-1 Subcarrier (mounting base)
20-2, 420-2, 520-2 Subcarrier (mounting base)
20-3, 420-3, 520-3 Subcarrier (mounting base)
21, 421, 521 Upper surface
21-1 Upper surface
21-2 Upper surface
21-3 Upper surface
22 Side surface
22-1 Side surface
22-2 Side surface
22-3 Side surface
23 Bottom surface (mounting base bottom surface)
30 LD (optical semiconductor device)
30-1 LD
30-2 LD
30-3 LD
31 Emission surface
31-1 Emission surface
31-2 Emission surface
31-3 Emission surface
33 Lower surface
33-1 Lower surface
40 Substrate
41 Upper surface (surface)
42 Side surface
43 Bottom surface (substrate bottom surface)
50 PLC (optical waveguide)
51-1, 51-2, 51-3 Core
51-4, 51-7 Core
52 Clad
57-1, 57-2 Merging position
61 Incident surface
61-1 Incident surface
61-2 Incident surface
61-3 Incident surface
64 Emission surface
70 Gap
71 First metal layer
72 Second metal layer
73 Third metal layer
75 Metal layer
76 Metal layer
81, 82 Antireflection film
100 Integrated optical module
102 Main body
105 Cover
110 Package
180 Base
180a Upper surface (one inner surface)
182 Adhesive layer

The invention claimed is:

1. An integrated optical device comprising:
a mounting base;
an optical semiconductor device which is provided on a surface of the mounting base;
a substrate; and
an optical waveguide which is provided on a surface of the substrate,
wherein an incident surface of the optical waveguide is disposed to face an emission surface of the optical semiconductor device,
wherein light emitted from the optical semiconductor device is able to be incident to the optical waveguide,
wherein the optical semiconductor device is connected to the mounting base through a metal layer,
wherein the mounting base is connected to the substrate through the other metal layer,
wherein a mounting base bottom surface on the side opposite to a surface of the mounting base and a substrate bottom surface on the side opposite to a surface of the substrate are provided on the substantially same plane,
wherein the mounting base has a substantially rectangular parallelepiped shape including first to third outer surfaces,
wherein the first outer surface is an upper surface of the mounting base,
wherein the second outer surface is a first side surface of the mounting base,
wherein the third outer surface includes a second side surface which faces the first side surface, third and fourth side surfaces which are respectively adjacent to the first and second side surfaces to face them, and the mounting base bottom surface which faces the upper surface,
wherein the optical semiconductor device is mounted on the first outer surface of the mounting base,
wherein the optical semiconductor device is disposed to be optically coupled to the optical waveguide,
wherein the second outer surface of the mounting base is connected to a side surface of the substrate through the metal layer,
wherein at least a part of the third outer surface of the mounting base includes a roughened region, and
wherein the roughened region is provided in a front region near the first side surface in relation to a middle position between the first side surface and the second side surface.

2. The integrated optical device according to claim 1, wherein the surface roughness of the roughened region is larger than the surface roughness of the first and second outer surfaces.

3. The integrated optical device according to claim 1, wherein the roughened region has a maximum cross-sectional height (Rt) of 5 µm or more and 50 µm or less.

4. The integrated optical device according to claim 1, wherein the roughened region is provided on the third and fourth side surfaces, and
wherein the second side surface and the mounting base bottom surface are smooth surfaces not provided with the roughened region.

5. The integrated optical device according to claim 1, wherein two or more optical semiconductor devices are provided.

6. The integrated optical device according to claim 1, wherein the optical semiconductor device includes a first optical semiconductor device which outputs red light, a second optical semiconductor device which outputs green light, and a third optical semiconductor device which outputs blue light.

7. The integrated optical device according to claim 1, wherein an antireflection film is provided between the optical semiconductor device and the optical waveguide.

8. The integrated optical device according to claim 1, wherein a plurality of the optical semiconductor devices are provided,
wherein the plurality of optical semiconductor devices emit light having different wavelengths,
wherein the optical waveguide is provided with a core into which light emitted from the plurality of optical semiconductor devices is configured to be incident, and
wherein the plurality of cores are gathered together on the front side reaching the emission surface of the optical waveguide.

9. An integrated optical module comprising:
the integrated optical device according to claim 1; and
a package which accommodates the integrated optical device,
wherein in the integrated optical device, both the mounting base bottom surface and the substrate bottom surface are fixed to one inner surface of the package through an adhesive layer containing metal or resin.

10. The integrated optical module according to claim 9, wherein the adhesive layer is made of a material in which a filler is mixed with a resin.

11. The integrated optical module according to claim 9, wherein the adhesive layer has thermal conductivity of 4 W/m·K or more.

12. The integrated optical device according to Claim 1, wherein the surface roughness of the roughened region is larger than the surfaces of the mounting base other than the roughened region.

13. The integrated optical device according to Claim 1, wherein surfaces of the mounting base other than the roughened region has a maximum cross-sectional height (Rt) of 0.01 µm or more and less than 5 µm.

14. A method for manufacturing an integrated optical device comprising:
preparing a mounting base including first to third outer surfaces, having an optical semiconductor device mounted on the first outer surface, having a metal bonding material provided in the second outer surface, and having a roughened region formed in at least a part of the third outer surface,
wherein the mounting base has a substantially rectangular parallelepiped shape including first to third outer surfaces,
wherein the first outer surface is an upper surface of the mounting base,
wherein the second outer surface is a first side surface of the mounting base,
wherein the third outer surface includes a second side surface which faces the first side surface, third and fourth side surfaces which are respectively adjacent to the first and second side surfaces to face them, and the mounting base bottom surface which faces the upper surface,
wherein the optical semiconductor device is mounted on the first outer surface of the mounting base,
wherein the second outer surface of the mounting base is connected to a side surface of a substrate through a metal layer,
wherein at least a part of the third outer surface of the mounting base includes a roughened region, and
wherein the roughened region is provided in a front region near the first side surface in relation to a middle position between the first side surface and the second side surface;
adjusting a position of the optical semiconductor device to be optically coupled to an optical waveguide while heating the metal bonding material together with the mounting base by irradiating the roughened region with a laser beam in a state in which a side surface of the substrate provided with the optical waveguide is in contact with the second outer surface of the mounting base; and
fixing the optical semiconductor device by stopping the irradiation of the laser beam to cool the mounting base and metal-bonding the mounting base and the substrate.

* * * * *